(12) United States Patent
Hirata et al.

(10) Patent No.: US 12,178,058 B2
(45) Date of Patent: *Dec. 24, 2024

(54) PHOTOELECTRIC CONVERSION ELEMENT, SOLID-STATE IMAGING DEVICE, AND ELECTRONIC DEVICE

(71) Applicants: SONY GROUP CORPORATION, Tokyo (JP); SONY SEMICONDUCTOR SOLUTIONS CORPORATION, Kanagawa (JP)

(72) Inventors: Shintarou Hirata, Kanagawa (JP); Masahiro Joei, Kanagawa (JP); Kenichi Murata, Kanagawa (JP); Masashi Bando, Tokyo (JP); Yosuke Saito, Tokyo (JP); Ryosuke Suzuki, Kanagawa (JP)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/452,823

(22) Filed: Aug. 21, 2023

(65) Prior Publication Data

US 2024/0164122 A1 May 16, 2024

Related U.S. Application Data

(63) Continuation of application No. 17/250,425, filed as application No. PCT/JP2019/029804 on Jul. 30, 2019, now Pat. No. 11,778,841.

(30) Foreign Application Priority Data

Jul. 30, 2018 (JP) .................................. 2018-142985

(51) Int. Cl.
*H01L 27/146* (2006.01)
*H10K 30/30* (2023.01)
(Continued)

(52) U.S. Cl.
CPC ............. *H10K 30/82* (2023.02); *H10K 30/30* (2023.02); *H10K 39/32* (2023.02)

(58) Field of Classification Search
CPC ........ H10K 30/82; H10K 30/30; H10K 39/32; H10K 30/15; H01L 27/14625; H01L 27/14636; Y02E 10/549
See application file for complete search history.

(56) References Cited

U.S. PATENT DOCUMENTS

2010/0102450 A1  4/2010  Narayan
2011/0240123 A1  10/2011  Lin et al.
(Continued)

FOREIGN PATENT DOCUMENTS

CN  103050505 A  4/2013
CN  109417085 A  3/2019
(Continued)

OTHER PUBLICATIONS

Elangovan, et al., "RF sputtered wide work function indium molybdenum oxide thin films for solar cell application," Solar Energy, vol. 83, No. 5, May 2009, pp. 726-731.
(Continued)

*Primary Examiner* — Samuel Park
(74) *Attorney, Agent, or Firm* — CHIP LAW GROUP

(57) ABSTRACT

To provide a photoelectric conversion element that can improve image quality. Provided is a photoelectric conversion element including at least a first electrode, a work function control layer, a photoelectric conversion layer, an oxide semiconductor layer, and a second electrode in this order, and further including a third electrode, in which the
(Continued)

third electrode is provided apart from the second electrode and is provided facing the photoelectric conversion layer via an insulating layer, and the work function control layer contains a larger amount of oxygen than an amount of oxygen satisfying a stoichiometric composition.

12 Claims, 17 Drawing Sheets

(51) Int. Cl.
*H10K 30/82* (2023.01)
*H10K 39/32* (2023.01)

(56) References Cited

U.S. PATENT DOCUMENTS

| | | | |
|---|---|---|---|
| 2013/0093932 A1 | 4/2013 | Choo et al. | |
| 2014/0239271 A1* | 8/2014 | Leem | H10K 30/353 257/432 |
| 2015/0054995 A1 | 2/2015 | Choo et al. | |
| 2015/0188065 A1 | 7/2015 | Takimoto | |
| 2016/0037098 A1* | 2/2016 | Lee | H10K 39/32 257/292 |

FOREIGN PATENT DOCUMENTS

| | | | |
|---|---|---|---|
| CN | 109716527 A | | 5/2019 |
| CN | 110416328 A | * | 11/2019 |
| EP | 3242340 A1 | | 11/2017 |
| EP | 3490003 A1 | | 5/2019 |
| JP | 2002-231054 A | | 8/2002 |
| JP | 2017-157816 A | | 9/2017 |
| JP | 2018-060910 A | | 4/2018 |
| KR | 10-2013-0040439 A | | 4/2013 |
| KR | 10-2014-0106767 A | | 9/2014 |
| KR | 10-2019-0028661 A | | 3/2019 |
| TW | 201813073 A | | 4/2018 |
| TW | 1625848 B | | 6/2018 |
| WO | 2018/016570 A1 | | 1/2018 |
| WO | 2018/066256 A1 | | 4/2018 |

OTHER PUBLICATIONS

International Search Report and Written Opinion of PCT Application No. PCT/JP2019/029804, issued on Oct. 29, 2019, 10 pages of English Translation and 10 pages of ISRWO.
Notice of Allowance for U.S. Appl. No. 17/250,425, issued on Jun. 28, 2023, 2 pages.
Notice of Allowance for U.S. Appl. No. 17/250,425, issued on May 24, 2023, 10 pages.
Non-Final Office Action for U.S. Appl. No. 17/250,425, issued on Jan. 27, 2023, 15 pages.
International Preliminary Report on Patentability of PCT Application No. PCT/JP2019/029804, issued on Feb. 11, 2021, 10 pages of English Translation and 06 pages of IPRP.
Alves De Castro et al., "Molybdenum Oxides—From Fundamentals to Functionality", Advanced Science News, Advanced Materials, 2017, p. 1701619 (31 pages), vol. 29.
Bonnet, J. P. et al., "Surface Electrical Properties of Tungsten Oxides in Equilibrium with the Gas Phase", Oxidation of Metals, No. 3, 1979, vol. 13, pp. 273-282, Plenum Publishing Corporation.
Greiner, M. et al., "Transition Metal Oxide Work Functions: The Influence of Cation Oxidation State and Oxygen Vacancies", Advanced Functional Materials, 2012, pp. 4557-4568, vol. 2.
Patel, M. et al., All Transparent Metal Oxide Ultraviolet Photodetector:, Advanced Electronic Materials, 2015, pp. 1-9, vol. 1.

* cited by examiner

 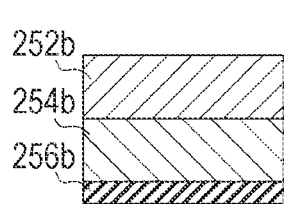 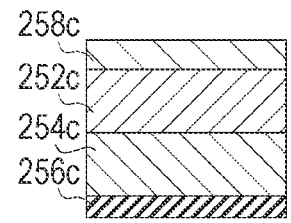 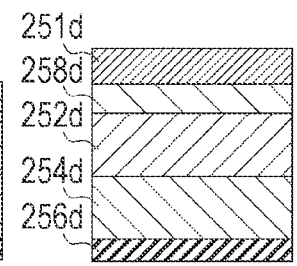
FIG. 7A  FIG. 7B  FIG. 7C  FIG. 7D
 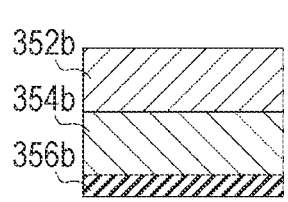 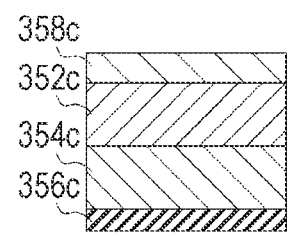 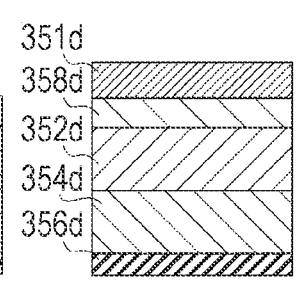
FIG. 8A  FIG. 8B  FIG. 8C  FIG. 8D

PHOTOELECTRIC CONVERSION ELEMENT, SOLID-STATE IMAGING DEVICE, AND ELECTRONIC DEVICE

CROSS REFERENCE TO RELATED APPLICATIONS

The present disclosure is a continuation of U.S. patent application Ser. No. 17/250,425, filed Jan. 20, 2021, which is a U.S. National Phase of International Patent Application No. PCT/JP2019/029804, filed Jul. 30, 2019, which claims the benefit of priority from prior Japanese Priority Patent Application JP 2018-142985 filed in the Japan Patent Office on Jul. 30, 2018, the entire content of which is hereby incorporated by reference. Each of the above-referenced applications is hereby incorporated herein by reference in its entirety.

TECHNICAL FIELD

The present technology relates to a photoelectric conversion element, a solid-state imaging device, and an electronic device.

BACKGROUND ART

These days, solid-state imaging devices such as charge-coupled device (CCD) image sensors or complementary metal oxide semiconductor (CMOS) image sensors are actively studied in order to achieve microminiaturization and image quality enhancement of digital cameras and the like.

For example, an imaging element in which a first electrode and a second electrode are arranged to face each other across a photoelectric conversion layer, while the second electrode is placed on the opposite side to the light incidence side, and an electrode for charge accumulation that is placed apart from the second electrode and is placed facing the photoelectric conversion layer via an insulating layer is provided on the second electrode side is disclosed (see Patent Document 2). In this imaging element, a charge generated by photoelectric conversion can be accumulated in the photoelectric conversion layer, and the charge accumulation portion can be completely depleted at the time of the start of light exposure. Hence, the decrease in the quality of captured images can be reduced.

CITATION LIST

Patent Document

Patent Document 1: Japanese Patent Application Laid-Open No. 2017-157816

SUMMARY OF THE INVENTION

Problems to be Solved by the Invention

However, the technology proposed by Patent Document 1 has a concern that further improvement in image quality cannot be achieved.

Thus, the present technology has been made in view of such a situation, and a main object of the present technology is to provide a photoelectric conversion element, a solid-state imaging device, and an electronic device that can further improve image quality.

Solutions to Problems

The present inventors conducted extensive studies in order to solve the object described above, and consequently have, surprisingly, succeeded in dramatically improving image quality and have completed the present technology.

In the present technology, as a first aspect, first, there is provided a photoelectric conversion element including at least, a first electrode, a work function control layer, a photoelectric conversion layer, an oxide semiconductor layer, and a second electrode in this order, and
 further including a third electrode, in which
  the third electrode is provided apart from the second electrode and is provided facing the photoelectric conversion layer via an insulating layer, and
  the work function control layer contains a larger amount of oxygen than an amount of oxygen satisfying a stoichiometric composition.

In the photoelectric conversion element according to the first aspect of the present technology, the work function control layer may contain a hexavalent molybdenum oxide, a pentavalent molybdenum oxide, and a tetravalent molybdenum oxide, and an amount of the hexavalent molybdenum oxide may be larger than a total amount of the pentavalent molybdenum oxide and the tetravalent molybdenum oxide.

In the photoelectric conversion element according to the first aspect of the present technology, the work function control layer may contain a molybdenum oxide of a non-stoichiometric composition.

In the photoelectric conversion element according to the first aspect of the present technology, the work function control layer may contain a hexavalent tungsten oxide, a pentavalent tungsten oxide, and a tetravalent tungsten oxide, and an amount of the hexavalent tungsten oxide may be larger than a total amount of the pentavalent tungsten oxide and the tetravalent tungsten oxide.

In the photoelectric conversion element according to the first aspect of the present technology, the work function control layer may contain a tungsten oxide of a nonstoichiometric composition.

In the photoelectric conversion element according to the first aspect of the present technology, the work function control layer may contain an oxide containing molybdenum and at least one metal element other than molybdenum.

In the photoelectric conversion element according to the first aspect of the present technology, an amount of the at least one metal element other than molybdenum contained in the oxide may be larger than an amount of the molybdenum contained in the oxide.

In the photoelectric conversion element according to the first aspect of the present technology, the at least one metal element other than molybdenum may be a metal element of group 12 of a periodic table, a metal element of group 13 of the periodic table, or a metal element of group 14 of the periodic table.

In the photoelectric conversion element according to the first aspect of the present technology, the at least one metal element other than molybdenum may be indium. In the photoelectric conversion element according to the first aspect of the present technology, a p-type buffer layer between the work function control layer and the photoelectric conversion layer may further be included.

In the photoelectric conversion element according to the first aspect of the present technology, an n-type buffer layer between the photoelectric conversion layer and the oxide semiconductor layer may further be included.

In the photoelectric conversion element according to the first aspect of the present technology, an auxiliary layer between the first electrode and the work function control layer may further be included.

Furthermore, in the present technology, as a second aspect, there is provided a photoelectric conversion element including at least, a first electrode, a work function control layer, a photoelectric conversion layer, an oxide semiconductor layer, and a second electrode in this order, and further including a third electrode, in which the third electrode is provided apart from the second electrode and is provided facing the photoelectric conversion layer via an insulating layer, and the work function control layer contains an oxide containing molybdenum and at least one metal element other than molybdenum.

In the photoelectric conversion element according to the second aspect of the present technology, an amount of the at least one metal element other than molybdenum contained in the oxide may be larger than an amount of the molybdenum contained in the oxide.

In the photoelectric conversion element according to the second aspect of the present technology, the at least one metal element other than molybdenum may be a metal element of group 12 of a periodic table, a metal element of group 13 of the periodic table, or a metal element of group 14 of the periodic table.

In the photoelectric conversion element according to the second aspect of the present technology, the at least one metal element other than molybdenum may be indium.

Further, in the present technology, there is provided a solid-state imaging device, in which at least one or a plurality of the photoelectric conversion elements according to the first aspect or the second aspect of the present technology and a semiconductor substrate are stacked for each of a plurality of one-dimensionally or two-dimensionally arranged pixels.

Furthermore, in the present technology, there is provided an electronic device including the solid-state imaging device according to the present technology.

Effects of the Invention

According to the present technology, image quality can be improved. Note that the effect described herein is not necessarily a limitative one, and any of the effects described in the present disclosure is possible.

BRIEF DESCRIPTION OF DRAWINGS

FIGS. 7A, 7B, 7C, and 7D are cross-sectional views for describing a method for manufacturing a photoelectric conversion element of the third embodiment to which the present technology is applied.

FIGS. 8A, 8B, 8C, and 8D are cross-sectional views for describing a method for manufacturing a photoelectric conversion element of the third embodiment to which the present technology is applied.

MODE FOR CARRYING OUT THE INVENTION

Figure 1:
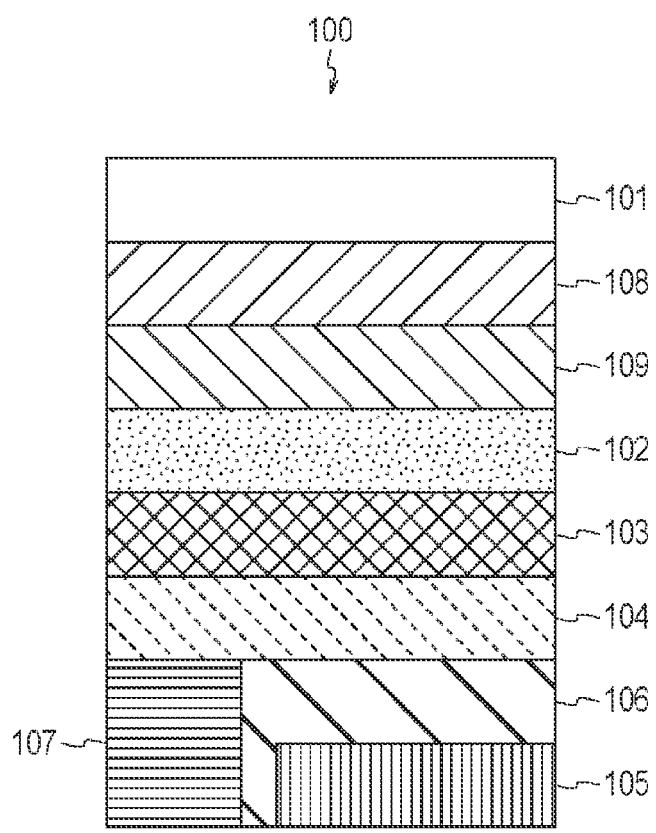
FIG. 1 is a cross-sectional view showing a configuration example of a photoelectric conversion element of a first embodiment to which the present technology is applied.

Hereinbelow, preferred forms for implementing the present technology are described. The embodiments described below show only examples of typical embodiments of the present technology, and the scope of the present technology should not be construed as being limited by them.

Note that the description is given in the following order.
1. Outline of present technology
2. First embodiment (example 1 of photoelectric conversion element)
3. Second embodiment (example 2 of photoelectric conversion element)
4. Third embodiment (example 3 of photoelectric conversion element)
5. Fourth embodiment (example 4 of photoelectric conversion element)
6. Fifth embodiment (example of solid-state imaging device)
7. Sixth embodiment (example of electronic device)
8. Use examples of solid-state imaging device to which present technology is applied 9. Application example to endoscopic surgery system
10. Application example to mobile bodies

1. Outline of Present Technology

First, an outline of the present technology is described.

As a configuration capable of suppressing the decrease in image quality (the quality of captured images), there is a technology regarding an imaging element that includes an oxide semiconductor layer (a charge accumulation layer) having a charge accumulation-transfer function (for example, an organic photoelectric conversion element). When a metal oxide that is an n-type semiconductor with high mobility is used as the oxide semiconductor layer, an excellent charge accumulation-transfer function is expected.

However, when an n-type semiconductor is used as the oxide semiconductor layer, it is necessary that electrons generated by light irradiation in an organic photodiode (OPD) (an organic photoelectric conversion layer) be rapidly transferred to and accumulated in the oxide semiconductor layer while the dark current of the organic photodiode (OPD) is suppressed. Thus, in the present technology, a structure in which a work function control layer is introduced is employed, and an inorganic compound such as a molybdenum oxide ($MoO_x$) or a tungsten oxide ($WO_x$) is contained in the work function control layer (WCL).

Meanwhile, an inorganic compound (a molybdenum oxide ($MoO_x$), a tungsten oxide ($WO_x$), or the like) used as work function control may, depending on the bonding state between metal molybdenum (Mo) or tungsten (W) and oxygen (O), react with water, etc. in the outside world and release hydrogen (H), and the hydrogen (H) may cause a variation in the characteristics of the oxide semiconductor layer. More specifically, for example, a reaction like below occurs, and hydrogen (H) is generated.

$MoO_2$ (tetravalent)$+2H_2O \rightarrow HMoO_4^- +3H^+ +2e^-$ (Reaction Formula)

The present technology has been made in view of the above situation. The present technology is a photoelectric conversion element and a solid-state imaging device each of which includes an oxide semiconductor layer and in each of which a work function control layer (WCL) is provided between an upper electrode and an organic photoelectric conversion layer. The work function control layer (WCL) contains a molybdenum (Mo) oxide or a tungsten (W) oxide that is an inorganic compound having a work function ($WF_W$) larger than the work function ($WF_e$) of an electrode for charge accumulation (an accumulation electrode, or a third electrode).

In the present technology, the work function control layer (WCL) behaves as an effective electrode, changes the internal electric field in a photoelectric conversion layer (for example, an organic photodiode (OPD) (an organic photoelectric conversion layer)), suppresses dark current, and allows electrons generated by light irradiation to be rapidly transferred to and accumulated in the oxide semiconductor layer; therefore, image quality (the quality of captured images) can be improved. In addition, since the work function control layer contains hexavalent molybdenum (Mo) or hexavalent tungsten (W) as a main component, the work function control layer does not experience the generation of hydrogen upon coming into contact with water, which may make interaction in a later step, and does not influence the characteristics of the oxide semiconductor layer.

Hereinbelow, a photoelectric conversion element, a solid-state imaging device, and an electronic device of embodiments according to the present technology are described in detail.

2. First Embodiment (Example 1 of Photoelectric Conversion Element)

A photoelectric conversion element of the first embodiment (example 1 of photoelectric conversion element) according to the present technology is a photoelectric conversion element including at least a first electrode, a work function control layer, a photoelectric conversion layer, an oxide semiconductor layer, and a second electrode in this order, and further including a third electrode, in which the third electrode is provided apart from the second electrode and is provided facing the photoelectric conversion layer via an insulating layer, and the work function control layer contains a larger amount of oxygen than an amount of oxygen satisfying a stoichiometric composition.

In the photoelectric conversion element of the first embodiment according to the present technology, image quality (the quality of captured images) can be improved. In more detail, the work function control layer contains oxygen excessively relative to a stoichiometric composition, that is, contains a larger amount of oxygen than the amount of oxygen satisfying a stoichiometric composition, thereby oxygen deficiency that has occurred in the work function control layer can be made up for, consequently the generation of, for example, a tetravalent/pentavalent molybdenum (Mo) oxide or tungsten (W) oxide, or the like can be suppressed and image quality (the quality of captured images) is stabilized without influencing the characteristics of the oxide semiconductor layer, and image quality (the quality of captured images) can be improved.

In the photoelectric conversion element of the first embodiment according to the present technology, it is preferable that the work function control layer contain a hexavalent molybdenum oxide, a pentavalent molybdenum oxide, and a tetravalent molybdenum oxide, and it is preferable that the amount of the hexavalent molybdenum oxide be larger than the total amount of the pentavalent molybdenum oxide and the tetravalent molybdenum oxide. Further, in the first embodiment according to the present technology, the work function control layer preferably contains a molybdenum oxide of a nonstoichiometric composition. Since the hexavalent molybdenum oxide or the molybdenum oxide of a nonstoichiometric composition does not experience further progress of oxidation, the hexavalent molybdenum oxide or the molybdenum oxide of a nonstoichiometric composition does not experience the generation of hydrogen, and contributes to the stability, improvement, etc. of image quality (the quality of captured images).

Furthermore, in the photoelectric conversion element of the first embodiment according to the present technology, it is preferable that the work function control layer contain a hexavalent tungsten oxide, a pentavalent tungsten oxide, and a tetravalent tungsten oxide, and it is preferable that the amount of the hexavalent tungsten oxide be larger than the total amount of the pentavalent tungsten oxide and the tetravalent tungsten oxide. Further, in the first embodiment according to the present technology, the work function control layer preferably contains a tungsten oxide of a nonstoichiometric composition. Since the hexavalent tungsten oxide or the tungsten oxide of a nonstoichiometric composition does not experience further progress of oxidation, and the hexavalent tungsten oxide or the tungsten oxide of a nonstoichiometric composition does not experience the generation of hydrogen, and contributes to the stability, improvement, etc. of image quality (the quality of captured images).

The photoelectric conversion element of the first embodiment according to the present technology may further include a p-type buffer layer between the work function control layer and the photoelectric conversion layer, and may further include an n-type buffer layer between the photoelectric conversion layer and the oxide semiconductor layer.

FIG. 1 shows a photoelectric conversion element 100 that is an example of the photoelectric conversion element of the first embodiment according to the present technology. FIG. 1 is a cross-sectional view of the photoelectric conversion element 100. As shown in FIG. 1, the photoelectric conversion element 100 includes at least a first electrode 101, a work function control layer 108, a p-type buffer layer 109, a photoelectric conversion layer 102, an n-type buffer layer 103, an oxide semiconductor layer 104, and a second electrode 107 in this order. The photoelectric conversion element 100 further includes a third electrode 105, and the third electrode 105 is provided apart from the second electrode 107 and is formed facing the photoelectric conversion layer 102 (the oxide semiconductor layer 104) via an insulating layer 106. Further, the second electrode 107 is placed opposite to the second electrode 105 via the insulating layer 106, and is electrically connected to the photoelectric conversion layer 102 (the oxide semiconductor layer 104) via an opening provided in the first insulating layer 106.

The work function control layer 108 contains a larger amount of oxygen than the amount of oxygen satisfying a stoichiometric composition, as described above. In the work function control layer 108, as a first example, a hexavalent molybdenum oxide, a pentavalent molybdenum oxide, and a tetravalent molybdenum oxide are contained, and the amount of the hexavalent molybdenum oxide is larger than the total amount of the pentavalent molybdenum oxide and the tetravalent molybdenum oxide. In the work function control layer 108, as a second example, a hexavalent tungsten oxide, a pentavalent tungsten oxide, and a tetravalent tungsten oxide are contained, and the amount of the hexavalent tungsten oxide is larger than the total amount of the pentavalent tungsten oxide and the tetravalent tungsten oxide. In the work function control layer 108, as a third example, a hexavalent molybdenum oxide, a pentavalent molybdenum oxide, a tetravalent molybdenum oxide, a hexavalent tungsten oxide, a pentavalent tungsten oxide, and a tetravalent tungsten oxide are contained, and the total amount of the hexavalent molybdenum oxide and the hexavalent tungsten oxide is larger than the total amount of the pentavalent molybdenum oxide, the tetravalent molybdenum oxide, the pentavalent tungsten oxide, and the tetravalent tungsten oxide.

The work function control layer 108 may contain an oxide containing molybdenum and at least one metal element other than molybdenum. Image quality (the quality of captured images) can be improved by an oxide containing molybdenum and at least one metal element other than molybdenum being contained in the work function control layer 108. In more detail, since the oxide containing molybdenum and at least one metal element other than molybdenum contained in the work function control layer 108 is chemically stable as compared to a molybdenum oxide (for example, a molybdenum oxide of a stoichiometric composition, or an oxide containing only low-valent (for example, tetravalent or pentavalent) molybdenum), the oxide does not experience the generation of hydrogen upon coming into contact with water, which may make interaction in a later step, and does not influence the characteristics of the oxide semiconductor layer. Further, even if at least one metal element other than molybdenum is contained in the oxide, the characteristics of the photoelectric conversion element (the work function control layer) are not impaired.

In the work function control layer 108, it is preferable that the amount of at least one metal element other than molybdenum contained in the oxide be larger than the amount of molybdenum contained in the oxide; by this preferred manner, the oxide is likely to be formed such that at least one metal element surrounds molybdenum, and forms a more chemically stable structure. Then, this more chemically stable oxide can suppress the generation of hydrogen caused by oxidation of molybdenum (Mo) more.

The ratio (content amount ratio) between the content amount of at least one metal element other than molybdenum and the content amount of molybdenum in the oxide may be optional in terms of molar ratio (the mol of at least one metal element other than molybdenum:the mol of molybdenum), but is preferably 6.7:3.3 to 7.3:2.7, and more preferably 7:3. As a preferred oxide, for example, the molar ratio between indium (In) and molybdenum (Mo) is 7:3 (In:Mo). Note that, if the content amount of indium (In) in the oxide is too large, the energy level may be unfit, and if the content amount of indium (In) is too small, the effect of chemical stability may be weakened. Thus, it is presumed that the energy level and the effect of chemical stability are in a trade-off relation.

In the work function control layer 108, the at least one metal element other than molybdenum is preferably a metal element of group 12 of the periodic table, a metal element of group 13 of the periodic table, or a metal element of group 14 of the periodic table. Examples of the metal element of group 12 of the periodic table include zinc (Zn), cadmium (Cd), and mercury (Hg). Examples of the metal element of group 13 of the periodic table include aluminum (Al), gallium (Ga), indium (In), and thallium (Tl), among which indium (In) is preferable. Further, examples of preferred oxides include InMoOx (IMO) with a large electron affinity. Moreover, if the amount of oxygen in InMoOx (IMO) is increased (the partial pressure of oxygen is raised), the electron affinity is increased, and a function as a work function control layer is achieved more easily. Examples of the metal element of group 14 of the periodic table include germanium (Ge), tin (Sn), and lead (Pb).

The oxide semiconductor layer 104 may contain an oxide semiconductor material. Examples of the oxide semiconductor material include IGZO (an In—Ga—Zn—O-based oxide semiconductor), ZTO (a Zn—Sn—O-based oxide semiconductor), IGZTO (an In—Ga—Zn—Sn—O-based oxide semiconductor), GTO (a Ga—Sn—O-based oxide semiconductor), and IGO (an In—Ga—O-based oxide semiconductor). The oxide semiconductor layer preferably uses at least one of the oxide semiconductor materials mentioned above, and preferably uses, among them, IGZO. Further, examples of materials to be contained in the oxide semiconductor layer 104 include transition metal dichalcogenides, silicon carbide, diamond, graphene, carbon nanotubes, and organic semiconductor materials such as condensed polycyclic hydrocarbon compounds and condensed heterocyclic compounds.

The thickness of the oxide semiconductor layer 104 is, for example, not less than 30 nm and not more than 200 nm, and preferably not less than 60 nm and not more than 150 nm.

The oxide semiconductor layer 104 is a layer for accumulating a signal charge generated in the photoelectric conversion layer 102 and transferring the signal charge to the second electrode (readout electrode) 107. The oxide semiconductor layer 104 preferably uses a material that has a higher mobility of charge than the photoelectric conversion layer 102 and yet has a large band gap. Thereby, for example, the speed of charge transfer can be improved, and the injection of holes from the second electrode (readout electrode) 107 to the oxide semiconductor layer 104 is suppressed.

The photoelectric conversion layer 102 is a layer that converts light energy to electrical energy, and is, for example, a layer that provides a field where an exciton generated when the layer absorbs light in the wavelength range of not less than 400 nm and not more than 2500 nm separates into an electron and a hole. The thickness of the photoelectric conversion layer 15 is, for example, not less than 100 nm and not more than 1000 nm, and preferably not less than 300 nm and not more than 800 nm.

Examples of materials to be contained in the photoelectric conversion layer 102 include organic-based materials and inorganic-based materials.

In a case where the photoelectric conversion layer 102 contains an organic-based material, the photoelectric conversion layer may have configurations like below ((1) to (4)). Any of the following four types may be employed.

(1) Containing a p-type organic semiconductor.
(2) Containing an n-type organic semiconductor.
(3) Including a stacked structure of a p-type organic semiconductor layer and an n-type organic semiconductor layer. Including a stacked structure of a p-type organic semiconductor layer, a mixed layer (a bulk heterostructure) of a p-type organic semiconductor and an n-type organic semiconductor, and an n-type organic semiconductor layer. Including a stacked structure of a p-type organic semiconductor layer and a mixed layer (a bulk heterostructure) of a p-type organic semiconductor and an n-type organic semiconductor. Including a stacked structure of an n-type organic semiconductor layer and a mixed layer (a bulk heterostructure) of a p-type organic semiconductor and an n-type organic semiconductor.
(4) Including a mixture (a bulk heterostructure) of a p-type organic semiconductor and an n-type organic semiconductor.

However, the stacking order may be arbitrarily changed.

As the p-type organic semiconductor, naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, a metal complex having a heterocyclic compound as a ligand, polythiophene derivatives, polybenzothiadiazole derivatives, polyfluorene derivatives, and the like may be given.

As the n-type organic semiconductor, fullerenes and fullerene derivatives (for example, fullerenes such as C60, C70, and C74 (higher fullerenes), endohedral fullerenes and the like, and fullerene derivatives (for example, fullerene fluorides, PCBM fullerene compounds, fullerene polymers, and the like)), an organic semiconductor having a larger (deeper) HOMO and a larger (deeper) LUMO than the p-type organic semiconductor, and transparent inorganic metal oxides may be given. As the n-type organic semiconductor, specifically, an organic molecule, an organic metal complex, or a subphthalocyanine derivative having, in part of the molecular framework, a heterocyclic compound containing a nitrogen atom, an oxygen atom, or a sulfur atom, such as a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, or a polyfluorene derivative, may be given. Examples of groups or the like included in the fullerene derivative include a halogen atom; a straight-chain, branched, or cyclic alkyl group or a phenyl group; a group having a straight-chain or annelated aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an aryl sulfide group; an alkyl sulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having a chalcogenide; a phosphine group; and a phosphono group; and derivatives of these. The thickness of the photoelectric conversion layer containing an organic-based material (occasionally referred to as an "organic photoelectric conversion layer") is not limited, but is, for example, $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, and still more preferably $1\times10^{-7}$ m to $1.8\times10^{-7}$ m.

Note that, although organic semiconductors are often classified into the p-type and the n-type, the p-type means that it is easy to transport holes and the n-type means that it is easy to transport electrons, and the p-type and the n-type are not limited to the interpretation of having holes or electrons as the majority carrier of thermal excitation like in inorganic semiconductors.

Alternatively, as materials to be contained in an organic photoelectric conversion layer that photoelectrically converts light of the wavelength of green, for example, rhodamine-based dyes, merocyanine-based dyes, quinacridone derivatives, subphthalocyanine-based dyes (subphthalocyanine derivatives), and the like may be given; as materials to be contained in an organic photoelectric conversion layer that photoelectrically converts blue light, for example, coumarinic acid dyes, tris(8-hydroxyquinolinato)aluminum (Alq3), merocyanine-based dyes, and the like may be given; and as materials to be contained in an organic photoelectric conversion layer that photoelectrically converts red light, for example, phthalocyanine-based dyes and subphthalocyanine-based dyes (subphthalocyanine derivatives) may be given.

Alternatively, as inorganic-based materials to be contained in the photoelectric conversion layer, crystalline silicon, amorphous silicon, microcrystalline silicon, crystalline selenium, amorphous selenium, CuInGaSe (CIGS), $CuInSe_2$ (CIS), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, which are chalcopyrite-based compounds, GaAs, InP, AlGaAs, InGaP, AlGaInP, and InGaAsP, which are group III-V compounds, and compound semiconductors such as CdSe, CdS, $In_2Se_3$, $In_2S_3$, $Bi_2Se_3$, $Bi_2S_3$, ZnSe, ZnS, PbSe, and PbS may be given. In addition, quantum dots containing these materials may be used for the photoelectric conversion layer.

Each of the second electrode (readout electrode) 107 and the third electrode (accumulation electrode) 105 is preferably a transparent electrode containing a transparent electrically conductive material. The second electrode (readout electrode) 107 and the third electrode (accumulation electrode) 105 may contain the same material, or may contain different materials. Each of the second electrode (readout electrode) 107 and the third electrode (accumulation electrode) 105 can be formed by the sputtering method or the chemical vapor deposition method (CVD). Note that, although FIG. 1 does not illustrate a transfer electrode, when a transfer electrode is provided in the photoelectric conversion element 100, the transfer electrode is preferably a transparent electrode containing a transparent electrically conductive material similarly to the second electrode (readout electrode) 107 and the third electrode (accumulation electrode) 105. In addition, also the transfer electrode can be formed by the sputtering method or the chemical vapor deposition method (CVD).

Examples of the transparent electrically conductive material include indium oxide, an indium-tin oxide (ITO, indium tin oxide, including Sn-doped $In_2O_3$, crystalline ITO, and amorphous ITO), an indium-zinc oxide (IZO, indium zinc oxide) in which indium is added as a dopant to zinc oxide, an indium-gallium oxide (IGO) in which indium is added as a dopant to gallium oxide, an indium-gallium-zinc oxide (IGZO, In—$GaZnO_4$) in which indium and gallium are added as dopants to zinc oxide, an indium-tin-zinc oxide (ITZO) in which indium and tin are added as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with other elements), an aluminum-zinc oxide (AZO) in which aluminum is added as a dopant to zinc oxide, a gallium-zinc oxide (GZO) in which gallium is added as a dopant to zinc oxide, titanium oxide ($TiO_2$), a niobium-titanium oxide (TNO) in which niobium (Nb) is added as a dopant to titanium oxide, antimony oxide, a spinel-type oxide, and an oxide having a $YbFe_2O_4$ structure.

The first electrode 101 includes, for example, a transparent electrically conductive film such as an indium tin oxide film or an indium zinc oxide film, or the like. As the material of the insulating layer 106, inorganic-based insulating materials such as silicon oxide-based materials, silicon nitride ($SiN_x$), and metal oxide high-dielectric insulating materials such as aluminum oxide ($Al_2O_3$) are given. In addition, organic-based insulating materials (organic polymers), examples including polymethyl methacrylate (PMMA), polyvinylphenol (PVP), polyvinyl alcohol (PVA), polyimides, polycarbonates (PC), polyethylene terephthalate (PET), polystyrene, silanol derivatives (silane coupling agents) such as N-2-(aminoethyl)-3-aminopropyltrimethoxysilane (AEAPTMS), 3-mercaptopropyltrimethoxysilane (MPTMS), and octadecyltrichlorosilane (OTS), novolak-type phenolic resins, fluorine-based resins, and a straight-chain hydrocarbon having, at one end, a functional group capable of binding to a control electrode, such as octadecanethiol and dodecyl isocyanate, may be given, and these may be used in combination. Note that, as silicon oxide-based materials, silicon oxide ($SiO_x$), BPSG, PSG, BSG, AsSG, PbSG, silicon oxynitride (SiON), SOG (spin-on glass), and low-permittivity materials (for example, polyaryl ethers, cycloperfluorocarbon polymers, benzocyclobutene, cyclic fluororesins, polytetrafluoroethylene, fluorinated aryl ethers, fluorinated polyimides, amorphous carbon, and organic SOG) are given.

The p-type buffer layer 109 is a layer for promoting the supply of holes generated by the photoelectric conversion layer 102 to the first electrode 101, and may contain, for example, molybdenum oxide ($MoO_3$), nickel oxide (NiO), vanadium oxide ($V_2O_5$), or the like. The p-type buffer layer (hole transportation layer) may contain an organic material such as poly(3,4-ethylenedioxythiophene) (PEDOT), N,N'-bis(3-methylphenyl)-N,N'-diphenylbenzidine (TPD), or 4,4',4"-tris[2-naphthyl(phenyl)amino]triphenylamine (2T-NATA).

The n-type buffer layer 103 is a layer for promoting the supply of electrons generated by the photoelectric conversion layer 102 to the second electrode 107, and may contain, for example, titanium oxide ($TiO_2$), zinc oxide (ZnO), or the like. The n-type buffer layer 103 may be formed also by stacking titanium oxide and zinc oxide. Further, the n-type buffer layer 103 may contain a high-molecular semiconductor material or an organic-based material such as a material that is an organic molecule or an organic metal complex including a heterocycle including N as part of the molecular framework, such as pyridine, quinoline, acridine, indole, imidazole, benzimidazole, or phenanthroline, and that has limited absorption in the visible light region.

The photoelectric conversion element of the first embodiment according to the present technology can be manufactured by using a known method, for example, the sputtering method, a method of performing patterning by photolithography technology and performing dry etching or wet etching, or a wet film formation method. Examples of the wet film formation method include the spin coating method, the immersion method, the casting method, various printing methods such as the screen printing method, the inkjet printing method, the offset printing method, and the gravure printing method, the stamping method, the spraying method, and various coating methods such as the air doctor coater method, the blade coater method, the rod coater method, the knife coater method, the squeeze coater method, the reverse roll coater method, the transfer roll coater method, the gravure coater method, the kiss coater method, the cast coater method, the spray coater method, the slit orifice coater method, and the calender coater method. Hereinbelow, methods for manufacturing photoelectric conversion layers of the first embodiment according to the present technology are specifically described using FIGS. 2A, 2B, 2C, 2D, 3A, 3B, 3C, 3D, 4A, 4B, 4C, 4D, and 4E. FIGS. 2A, 2B, 2C, 2D, 3A, 3B, 3C, 3D, 4A, 4B, 4C, 4D, and 4E are cross-sectional views for describing methods for manufacturing photoelectric conversion elements of the first embodiment according to the present technology.

First, method-1 for manufacturing a photoelectric conversion element of the first embodiment according to the present technology is described using FIGS. 2A, 2B, 2C, and 2D.

Figure 2:
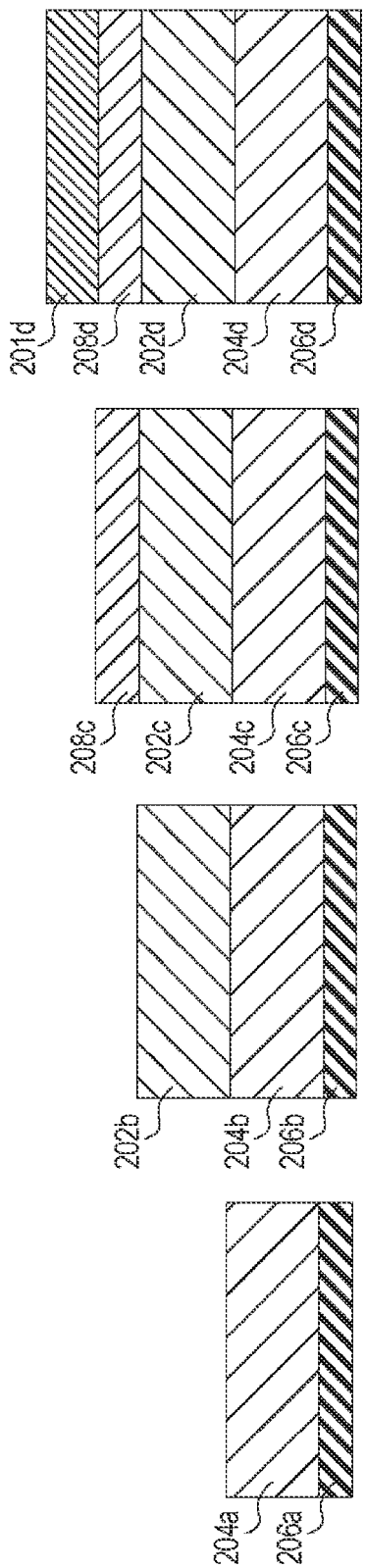
FIGS. 2A, 2B, 2C, and 2D are cross-sectional views for describing a method for manufacturing a photoelectric conversion element of the first embodiment to which the present technology is applied.

As shown in FIG. 2A, an oxide semiconductor layer 204a is formed on an insulating layer 206a. The film thickness of the oxide semiconductor layer 204a is 1 to 100 nm. Subsequently, as shown in FIG. 2B, an organic photodiode (PD) layer (organic photoelectric conversion layer) 202b is formed on the oxide semiconductor layer 204b on the insulating layer 206b. The film thickness of the organic photodiode (PD) layer 202b is 10 to 500 nm.

Next, as shown in FIG. 2C, a work function control layer 208c containing a molybdenum (Mo) oxide is formed on the organic photodiode (PD) layer 202c. In the work function control layer 208c, hexavalent molybdenum ($Mo^{6+}$) is a main component. The film thickness of the work function control layer 208c is 0.1 to 30 nm. Note that the organic photodiode (PD) layer 202c is formed on the oxide semiconductor layer 204c on the insulating layer 206c.

As shown in FIG. 2D, an upper transparent electrode layer (first electrode) 201d is formed as a film on the work function control layer 208d containing a molybdenum (Mo) oxide by sputtering. At this time, a low damage process is selected in order to prevent an event in which sputtering damage occurs in the Mo oxide and oxygen deficiency occurs, and $Mo^{6+}$ is reduced to, for example, $Mo^{5+}$. As a result, a desired film (a work function control layer 208d) in which hexavalent molybdenum ($Mo^{6+}$) is a main component is obtained. Note that the work function control layer 208d is formed on the organic photodiode (PD) layer 202d. The organic photodiode (PD) layer 202d is formed on the oxide semiconductor layer 204d on the insulating layer 206d.

Method-2 for manufacturing a photoelectric conversion element of the first embodiment according to the present technology is described using FIGS. 3A, 3B, 3C, and 3D.

Figure 3:
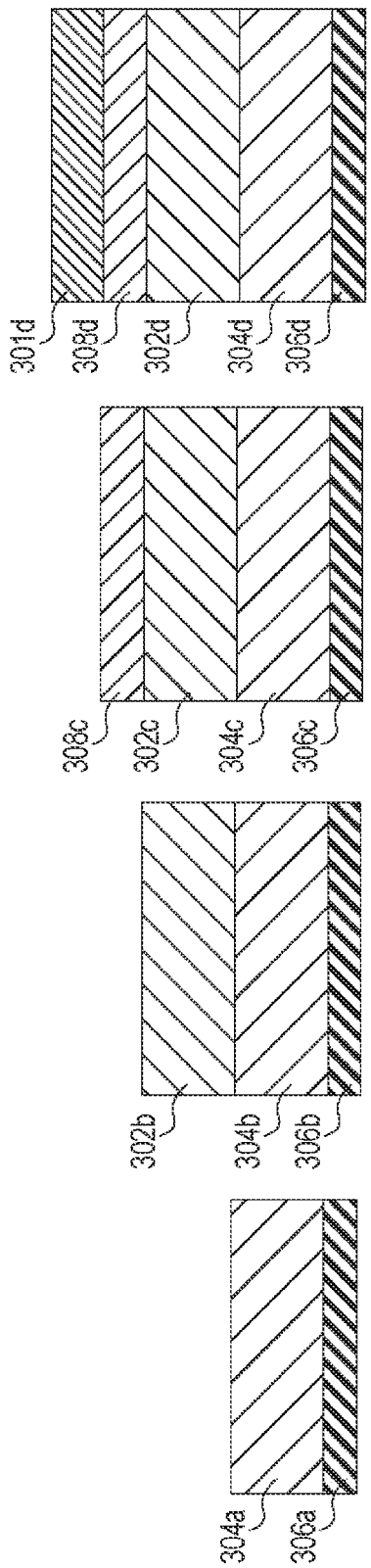
FIGS. 3A, 3B, 3C, and 3D are cross-sectional views for describing a method for manufacturing a photoelectric conversion element of the first embodiment to which the present technology is applied.

As shown in FIG. 3A, an oxide semiconductor layer 304a is formed on an insulating layer 306a. The film thickness of the oxide semiconductor layer 304a is 1 to 100 nm. Subsequently, as shown in FIG. 3B, an organic photodiode (PD) layer (organic photoelectric conversion layer) 302b is formed on the oxide semiconductor layer 304b on the insulating layer 306b. The film thickness of the organic photodiode (PD) layer 302b is 10 to 500 nm.

Next, as shown in FIG. 3C, a work function control layer 308c containing a molybdenum (Mo) oxide is formed on the organic photodiode (PD) layer 302c. In the work function control layer 308c, hexavalent molybdenum ($Mo^{6+}$) is a main component. The film thickness of the work function control layer 308 is 0.1 to 30 nm. Note that the organic photodiode (PD) layer 302c is formed on the oxide semiconductor layer 304c on the insulating layer 306c.

As shown in FIG. 3D, an upper transparent electrode layer (first electrode) 301d is formed as a film on the work function control layer 308d containing a molybdenum (Mo) oxide by vapor deposition. By selecting a film formation technique that forms the upper transparent electrode layer 301d while keeping the lower layers free from damage, the reduction of $Mo^{6+}$ is suppressed, and a desired film (a work function control layer 308d) in which hexavalent molybdenum ($Mo^{6+}$) is a main component is obtained. Note that the work function control layer 308d is formed on the organic photodiode (PD) layer 302d. The organic photodiode (PD) layer 302d is formed on the oxide semiconductor layer 304d on the insulating layer 306d.

Method-3 for manufacturing a photoelectric conversion element of the first embodiment according to the present technology is described using FIGS. 4A, 4B, 4C, 4D, and 4E.

Figure 4:
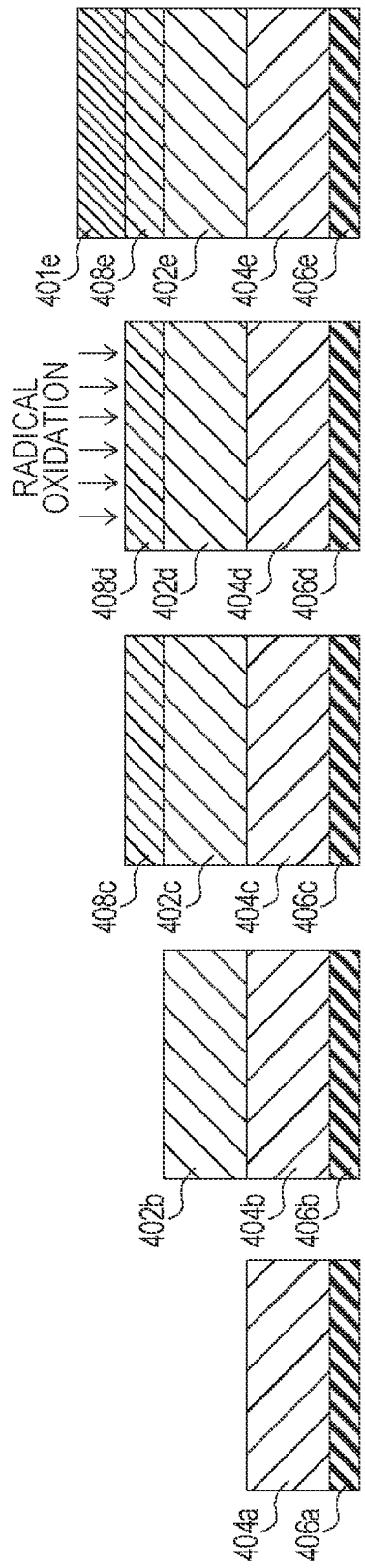
FIGS. 4A, 4B, 4C, 4D, and 4E are cross-sectional views for describing a method for manufacturing a photoelectric conversion element of the first embodiment to which the present technology is applied.

As shown in FIG. 4A, an oxide semiconductor layer 404a is formed on an insulating layer 406a. The film thickness of the oxide semiconductor layer 404a is 1 to 100 nm. Subsequently, as shown in FIG. 4B, an organic photodiode (PD) layer (organic photoelectric conversion layer) 402b is formed on the oxide semiconductor layer 404b on the insulating layer 406b. The film thickness of the organic photodiode (PD) layer 402b is 10 to 500 nm.

Next, as shown in FIG. 4C, a work function control layer 408c containing a molybdenum (Mo) oxide is formed on the organic photodiode (PD) layer 402c. In the work function control layer 408c, hexavalent molybdenum ($Mo^{6+}$) is a main component. The film thickness of the work function control layer 408c is 0.1 to 30 nm. Note that the organic photodiode (PD) layer 402c is formed on the oxide semiconductor layer 404c on the insulating layer 406c.

As shown in FIG. 4D, radical oxidation treatment is performed on the work function control layer 408d in order to create a state of containing oxygen excessively relative to a stoichiometric composition of the molybdenum (Mo) oxide. The work function control layer 408d is formed on the organic photodiode (PD) layer 402d. The organic photodiode (PD) layer 402d is formed on the oxide semiconductor layer 404d on the insulating layer 406d.

Finally, as shown in FIG. 4E, an upper transparent electrode layer (first electrode) 401e is formed as a film on the work function control layer 408e containing a molybdenum (Mo) oxide by sputtering. At this time, the molybdenum (Mo) oxide is in the state of containing oxygen excessively relative to a stoichiometric composition; therefore, oxygen deficiency occurring in the molybdenum (Mo) oxide can be make up for at the time of the film formation of the upper transparent electrode 401e, and as a result, the generation of a tetravalent/pentavalent molybdenum (Mo) oxide can be suppressed. As a result, a desired film (a work function control layer 408e) in which hexavalent molybdenum ($Mo^{6+}$) is a main component is obtained. Note that the work function control layer 408e is formed on the organic photodiode (PD) layer 402e. The organic photodiode (PD) layer 402e is formed on the oxide semiconductor layer 404e on the insulating layer 406e.

3. Second Embodiment (Example 2 of Photoelectric Conversion Element)

A photoelectric conversion element of a second embodiment according to the present technology (example 2 of the photoelectric conversion element) is a photoelectric conversion element that includes at least a first electrode, a work function control layer, a photoelectric conversion layer, an oxide semiconductor layer, and a second electrode in this order and further includes a third electrode, in which the third electrode is provided apart from the second electrode and is provided facing the photoelectric conversion layer via an insulating layer, the work function control layer contains a larger amount of oxygen than the amount of oxygen satisfying a stoichiometric composition, and an auxiliary layer is further provided between the first electrode and the work function control layer. The auxiliary layer has the effect of preventing damage to the work function control layer due to sputtering or the like used for the fabrication of the first electrode (an upper electrode) provided thereon, and further has the effect of not impairing the control function (electronic function) of the work function control layer. As long as these two effects are exhibited, the auxiliary layer may contain arbitrary materials; for example, the auxiliary layer may contain a non-oxide material or an oxide material, and may employ, for example, HATCN, an oxide material not having insulating properties (a thin film of $SiO_2$), etc.

In the photoelectric conversion element of the second embodiment according to the present technology, image quality (the quality of captured images) can be improved. In more detail, the work function control layer contains oxygen excessively relative to a stoichiometric composition, that is, contains a larger amount of oxygen than the amount of oxygen satisfying a stoichiometric composition, and the auxiliary layer is provided, thereby oxygen deficiency that has occurred in the work function control layer can be made up for, consequently the generation of, for example, a tetravalent/pentavalent molybdenum (Mo) oxide or tungsten (W) oxide, or the like can be suppressed and image quality (the quality of captured images) is further stabilized without influencing the characteristics of the oxide semiconductor layer, and image quality (the quality of captured images) can be further improved.

In the photoelectric conversion element of the second embodiment according to the present technology, it is preferable that the work function control layer contain a hexavalent molybdenum oxide, a pentavalent molybdenum oxide, and a tetravalent molybdenum oxide, and it is preferable that the amount of the hexavalent molybdenum oxide be larger than the total amount of the pentavalent molybdenum oxide and the tetravalent molybdenum oxide. Further, in the second embodiment according to the present technology, the work function control layer preferably contains a molybdenum oxide of a nonstoichiometric composition. Since the hexavalent molybdenum oxide or the molybdenum oxide of a nonstoichiometric composition does not experience further progress of oxidation, the hexavalent molybdenum oxide or the molybdenum oxide of a nonstoichiometric composition does not experience the generation of hydrogen, and contributes to the stability, improvement, etc. of image quality (the quality of captured images).

Furthermore, in the photoelectric conversion element of the second embodiment according to the present technology, it is preferable that the work function control layer contain a hexavalent tungsten oxide, a pentavalent tungsten oxide, and a tetravalent tungsten oxide, and it is preferable that the amount of the hexavalent tungsten oxide be larger than the total amount of the pentavalent tungsten oxide and the tetravalent tungsten oxide. Further, in the second embodiment according to the present technology, the work function control layer preferably contains a tungsten oxide of a nonstoichiometric composition. Since the hexavalent tungsten oxide or the tungsten oxide of a nonstoichiometric composition does not experience further progress of oxidation, and the hexavalent tungsten oxide or the tungsten oxide of a nonstoichiometric composition does not experience the generation of hydrogen, and contributes to the stability, improvement, etc. of image quality (the quality of captured images).

The photoelectric conversion element of the second embodiment according to the present technology may further include a p-type buffer layer between the work function control layer and the photoelectric conversion layer, and may further include an n-type buffer layer between the photoelectric conversion layer and the oxide semiconductor layer.

The photoelectric conversion element of the second embodiment according to the present technology can be manufactured by using a known method, for example, the sputtering method, a method of performing patterning by photolithography technology and performing dry etching or wet etching, or a wet film formation method. Examples of the wet film formation method include the spin coating method, the immersion method, the casting method, various printing methods such as the screen printing method, the inkjet printing method, the offset printing method, and the gravure printing method, the stamping method, the spraying method, and various coating methods such as the air doctor coater method, the blade coater method, the rod coater method, the knife coater method, the squeeze coater method, the reverse roll coater method, the transfer roll coater method, the gravure coater method, the kiss coater method, the cast coater method, the spray coater method, the slit orifice coater method, and the calender coater method.

Hereinbelow, methods for manufacturing photoelectric conversion layers of the second embodiment according to the present technology are specifically described using FIGS. 5A, 5B, 5C, 5D, and 5E. FIGS. 5A, 5B, 5C, 5D, and 5E are cross-sectional views for describing methods for manufacturing photoelectric conversion elements of the second embodiment according to the present technology.

Method-1 for manufacturing a photoelectric conversion element of the second embodiment according to the present technology is described using FIGS. 5A, 5B, 5C, 5D, and 5E.

Figure 5:
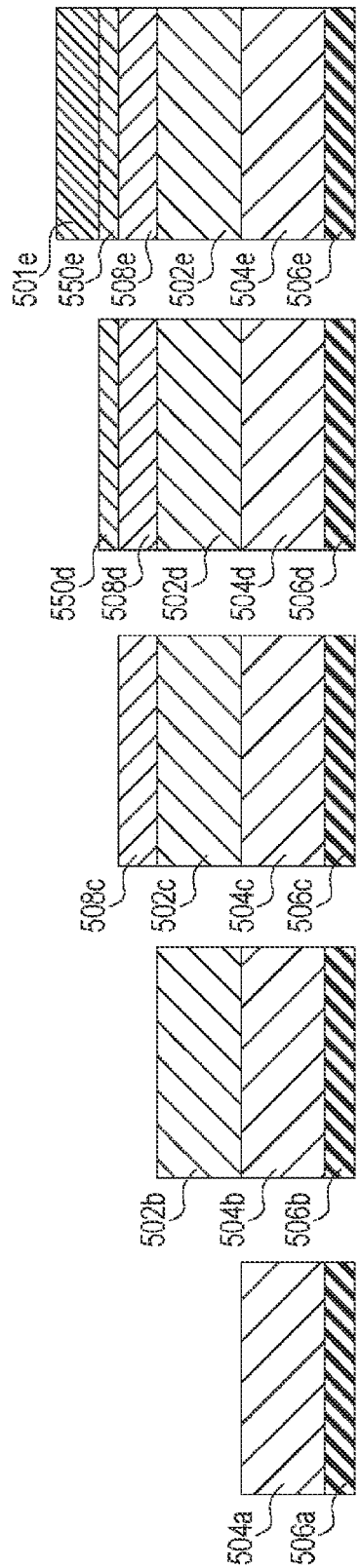
FIGS. 5A, 5B, 5C, 5D, and 5E are cross-sectional views for describing a method for manufacturing a photoelectric conversion element of a second embodiment to which the present technology is applied.

As shown in FIG. 5A, an oxide semiconductor layer 504a is formed on an insulating layer 506a. The film thickness of the oxide semiconductor layer 504a is 1 to 100 nm. Subsequently, as shown in FIG. 5B, an organic photodiode (PD) layer (organic photoelectric conversion layer) 502b is formed on the oxide semiconductor layer 504b on the insulating layer 506b. The film thickness of the organic photodiode (PD) layer 502b is 10 to 500 nm.

Next, as shown in FIG. 5C, a work function control layer 508c containing a molybdenum (Mo) oxide is formed on the organic photodiode (PD) layer 502c. In the work function control layer 508c, hexavalent molybdenum ($Mo^{6+}$) is a main component. The film thickness of the work function control layer 508c is 0.1 to 30 nm. Note that the organic photodiode (PD) layer 502c is formed on the oxide semiconductor layer 504c on the insulating layer 506c.

As shown in FIG. 5D, an auxiliary layer 550d (for example, an auxiliary layer 550d containing HATCN) is formed on the work function control layer 508d in which hexavalent molybdenum ($Mo^{6+}$) is a main component. The film thickness of the auxiliary layer 550d is 0.1 to 30 nm. The work function control layer 508d is formed on the organic photodiode (PD) layer 502d. The organic photodiode (PD) layer 502d is formed on the oxide semiconductor layer 504d on the insulating layer 506d.

Finally, as shown in FIG. 5E, an upper transparent electrode layer (first electrode) 501e is formed as a film on the auxiliary layer 550e by sputtering. At this time, the auxiliary layer 550e serves as a damage buffer layer at the time of the formation of the upper transparent electrode 501e, and can suppress the reduction of molybdenum $(Mo)^{6+}$ in the work function control layer 508e in which hexavalent molybdenum ($Mo^{6+}$) is a main component.

As a result, a desired film (a work function control layer 508e) in which hexavalent molybdenum ($Mo^{6+}$) is a main component is obtained. The work function control layer 508e is formed on the organic photodiode (PD) layer 502e. The organic photodiode (PD) layer 502e is formed on the oxide semiconductor layer 504e on the insulating layer 506e.

For the photoelectric conversion element of the second embodiment according to the present technology, the matter described in the section of the photoelectric conversion element of the first embodiment according to the present technology (including the description regarding FIG. 1) can be applied as it is except for the above description.

4. Third Embodiment (Example 3 of Photoelectric Conversion Element)

A photoelectric conversion element of a third embodiment according to the present technology (example 3 of the photoelectric conversion element) is a photoelectric conversion element that includes at least a first electrode, a work function control layer, a photoelectric conversion layer, an oxide semiconductor layer, and a second electrode in this order and further includes a third electrode, in which the third electrode is provided apart from the second electrode and is provided facing the photoelectric conversion layer via an insulating layer, and the work function control layer contains an oxide containing molybdenum and at least one metal element other than molybdenum.

According to the photoelectric conversion element of the third embodiment according to the present technology, image quality (the quality of captured images) can be improved by an oxide containing molybdenum and at least one metal element other than molybdenum being contained in the work function control layer. In more detail, since the oxide containing molybdenum and at least one metal element other than molybdenum contained in the work function control layer of the photoelectric conversion element of the third embodiment according to the present technology is chemically stable as compared to a molybdenum oxide (for example, a molybdenum oxide of a stoichiometric composition, or an oxide containing only low-valent (for example, tetravalent or pentavalent) molybdenum), the oxide does not experience the generation of hydrogen upon coming into contact with water, which may make interaction in a later step, and does not influence the characteristics of the oxide semiconductor layer. Further, even if at least one metal element other than molybdenum is contained in the oxide, the characteristics of the photoelectric conversion element (the work function control layer) are not impaired. In the photoelectric conversion element of the third embodiment according to the present technology, it is preferable that the amount of at least one metal element other than molybdenum contained in the oxide be larger than the amount of molybdenum contained in the oxide; by this preferred manner, the oxide is likely to be formed such that at least one metal element surrounds molybdenum, and forms a more chemically stable structure. Then, this more chemically stable oxide can suppress the generation of hydrogen caused by oxidation of molybdenum (Mo) more.

The ratio (content amount ratio) between the content amount of at least one metal element other than molybdenum and the content amount of molybdenum in the oxide may be optional in terms of molar ratio (the mol of at least one metal element other than molybdenum:the mol of molybdenum), but is preferably 6.7:3.3 to 7.3:2.7, and more preferably 7:3. As a preferred oxide, for example, the molar ratio between indium (In) and molybdenum (Mo) is 7:3 (In:Mo). Note that, if the content amount of indium (In) in the oxide is too large, the energy level may be unfit, and if the content amount of indium (In) is too small, the effect of chemical stability may be weakened. Thus, it is presumed that the energy level and the effect of chemical stability are in a trade-off relation.

In the photoelectric conversion element of the third embodiment according to the present technology, the at least one metal element other than molybdenum is preferably a metal element of group 12 of the periodic table, a metal element of group 13 of the periodic table, or a metal element of group 14 of the periodic table. Examples of the metal element of group 12 of the periodic table include zinc (Zn), cadmium (Cd), and mercury (Hg). Examples of the metal element of group 13 of the periodic table include aluminum (Al), gallium (Ga), indium (In), and thallium (Tl), among which indium (In) is preferable. Further, examples of preferred oxides include $InMoO_x$ (IMO) with a large electron affinity. Moreover, if the amount of oxygen in $InMoO_x$ (IMO) is increased (the partial pressure of oxygen is raised), the electron affinity is increased, and a function as a work function control layer is achieved more easily. Examples of the metal element of group 14 of the periodic table include germanium (Ge), tin (Sn), and lead (Pb).

The photoelectric conversion element of the third embodiment according to the present technology may further include a p-type buffer layer between the work function control layer and the photoelectric conversion layer, and may further include an n-type buffer layer between the photoelectric conversion layer and the oxide semiconductor layer.

Figure 6:
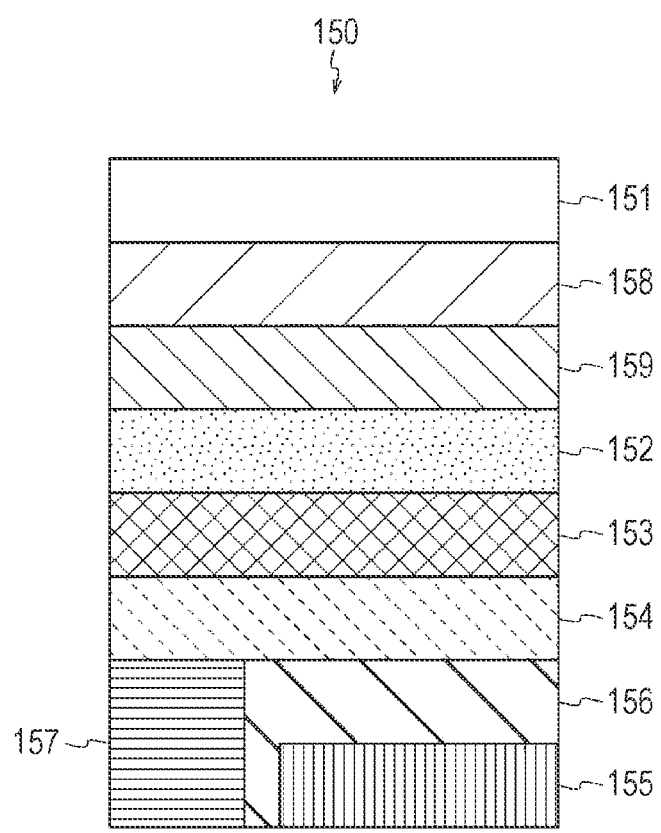
FIG. 6 is a cross-sectional view showing a configuration example of a photoelectric conversion element of a third embodiment to which the present technology is applied.

FIG. 6 shows a photoelectric conversion element 150 that is an example of the photoelectric conversion element of the third embodiment according to the present technology. FIG. 6 is a cross-sectional view of the photoelectric conversion element 150. As shown in FIG. 6, the photoelectric conversion element 150 includes at least a first electrode 151, a work function control layer 158, a p-type buffer layer 159, a photoelectric conversion layer 152, an n-type buffer layer 153, an oxide semiconductor layer 154, and a second electrode 157 in this order. The photoelectric conversion element 150 further includes a third electrode 155, and the third electrode 155 is provided apart from the second electrode 157 and is formed facing the photoelectric conversion layer 152 (the oxide semiconductor layer 154) via an insulating layer 156. Further, the second electrode 157 is placed opposite to the second electrode 155 via the insulating layer 156, and is electrically connected to the photoelectric conversion layer 152 (the oxide semiconductor layer 154) via an opening provided in the first insulating layer 156.

The work function control layer 158 contains an oxide containing molybdenum and at least one metal element other than molybdenum, as described above. The oxide containing molybdenum and at least one metal element other than molybdenum is, for example, an oxide containing molybdenum (Mo) and indium (In), and a preferred oxide is an oxide in which the amount of indium (In) is larger than the amount of molybdenum (Mo) and indium (In) is chemically stably formed so as to surround molybdenum (Mo).

The configuration of the oxide semiconductor layer 154 is a configuration similar to the configuration of the oxide semiconductor layer 104 described above, and therefore herein a detailed description is omitted. Further, the configuration of the photoelectric conversion layer 152 is a configuration similar to the configuration of the photoelectric conversion layer 102 described above, and therefore herein a detailed description is omitted.

The configurations of the second electrode (readout electrode) 157 and the third electrode (accumulation electrode) 155 are similar to the configurations of the second electrode (readout electrode) 107 and the third electrode (accumulation electrode) 105 described above, respectively, and therefore herein a detailed description is omitted. Further, the configuration of the first electrode 151 is similar to the configuration of the first electrode 101 described above, and therefore herein a detailed description is omitted.

Furthermore, the configurations of the insulating layer 156, the p-type buffer layer 159, and the n-type buffer layer 153 are similar to the configurations of the insulating layer 106, the p-type buffer layer 109, and the n-type buffer layer 103 described above, respectively, and therefore herein a detailed description is omitted.

The photoelectric conversion element of the third embodiment according to the present technology can be manufactured by using a known method, for example, the sputtering method, a method of performing patterning by photolithography technology and performing dry etching or wet etching, or a wet film formation method. Examples of the wet film formation method include the spin coating method, the immersion method, the casting method, various printing methods such as the screen printing method, the inkjet printing method, the offset printing method, and the gravure printing method, the stamping method, the spraying method, and various coating methods such as the air doctor coater method, the blade coater method, the rod coater method, the knife coater method, the squeeze coater method, the reverse roll coater method, the transfer roll coater method, the gravure coater method, the kiss coater method, the cast coater method, the spray coater method, the slit orifice coater method, and the calender coater method.

Hereinbelow, methods for manufacturing photoelectric conversion layers of the third embodiment according to the present technology are specifically described using FIGS. 7A, 7B, 7C, 7D, 8A, 8B, 8C, 8D, 9A, 9B, 9C, 9D, and 9E. FIGS. 7A, 7B, 7C, 7D, 8A, 8B, 8C, 8D, 9A, 9B, 9C, 9D, and 9E are cross-sectional views for describing methods for manufacturing photoelectric conversion elements of the third embodiment according to the present technology.

First, method-1 for manufacturing a photoelectric conversion element of the third embodiment according to the present technology is described using FIGS. 7A, 7B, 7C, and 7D.

As shown in FIG. 7A, an oxide semiconductor layer 254a is formed on an insulating layer 256a. The film thickness of the oxide semiconductor layer 254a is 1 to 100 nm. Subsequently, as shown in FIG. 7B, an organic photodiode (PD) layer (organic photoelectric conversion layer) 252b is formed on the oxide semiconductor layer 254b on the insulating layer 256b. The film thickness of the organic photodiode (PD) layer 252b is 10 to 500 nm.

Next, as shown in FIG. 7C, a work function control layer 258c containing an oxide containing molybdenum and at least one metal element other than molybdenum (for example, InMoOx (IMO)) is formed on the organic photodiode (PD) layer 252c. The film thickness of the work function control layer 258c is 0.1 to 30 nm. Note that the organic photodiode (PD) layer 252c is formed on the oxide semiconductor layer 254c on the insulating layer 256c.

As shown in FIG. 7D, an upper transparent electrode layer (first electrode) 251d is formed as a film on the work function control layer 258d containing an oxide containing molybdenum and at least one metal element other than molybdenum (for example, InMoOx (IMO)) by sputtering. At this time, a low damage process is selected in order to prevent an event in which sputtering damage occurs in the Mo oxide and oxygen deficiency occurs, and $Mo^{6+}$ is reduced to, for example, $Mo^{5+}$. As a result, a desired film (a work function control layer 258d) in which hexavalent molybdenum ($Mo^{6+}$) is a main component is obtained. Note that the work function control layer 258d is formed on the organic photodiode (PD) layer 252d. The organic photodiode (PD) layer 252d is formed on the oxide semiconductor layer 254d on the insulating layer 256d.

Method-2 for manufacturing a photoelectric conversion element of the third embodiment according to the present technology is described using FIGS. 8A, 8B, 8C, and 8D.

As shown in FIG. 8A, an oxide semiconductor layer 354a is formed on an insulating layer 356a. The film thickness of the oxide semiconductor layer 354a is 1 to 100 nm. Subsequently, as shown in FIG. 8B, an organic photodiode (PD) layer (organic photoelectric conversion layer) 352b is formed on the oxide semiconductor layer 354b on the insulating layer 356b. The film thickness of the organic photodiode (PD) layer 352b is 10 to 500 nm.

Next, as shown in FIG. 8C, a work function control layer 358c containing an oxide containing molybdenum and at least one metal element other than molybdenum (for example, InMoOx (IMO)) is formed on the organic photodiode (PD) layer 352c. The film thickness of the work function control layer 358c is 0.1 to 30 nm. Note that the organic photodiode (PD) layer 352c is formed on the oxide semiconductor layer 354c on the insulating layer 356c.

As shown in FIG. 8D, an upper transparent electrode layer (first electrode) 351d is formed as a film on the work function control layer 358d containing an oxide containing molybdenum and at least one metal element other than molybdenum (for example, InMoOx (IMO)) by vapor deposition. A film formation technique that forms the upper transparent electrode layer 351d while keeping the lower layers free from damage is selected. Note that the work function control layer 358d is formed on the organic photodiode (PD) layer 352d. The organic photodiode (PD) layer 352d is formed on the oxide semiconductor layer 354d on the insulating layer 356d.

Method-3 for manufacturing a photoelectric conversion element of the third embodiment according to the present technology is described using FIGS. 9A, 9B, 9C, 9D, and 9E.

Figures 9A, 9B, 9C, 9D, 9E:
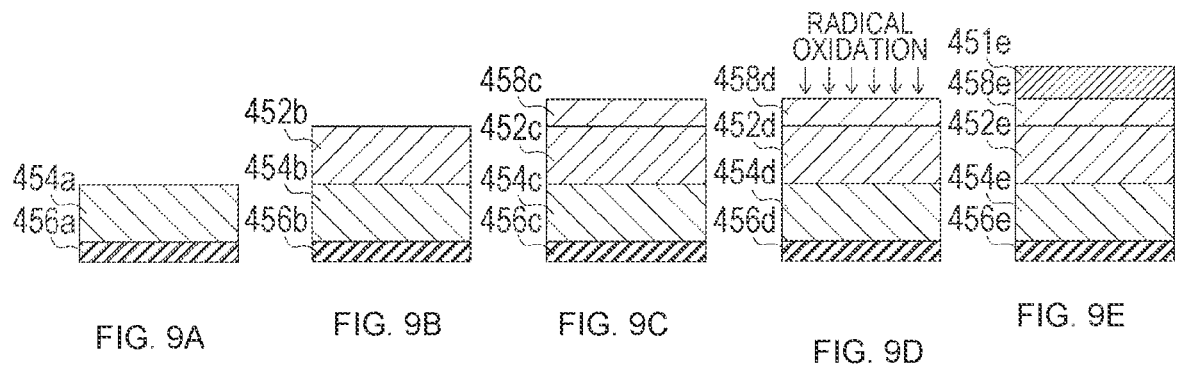
FIGS. 9A, 9B, 9C, 9D, and 9E are cross-sectional views cross-sectional views for describing a method for manufacturing a photoelectric conversion element of the third embodiment to which the present technology is applied.

As shown in FIG. 9A, an oxide semiconductor layer 454a is formed on an insulating layer 456a. The film thickness of the oxide semiconductor layer 454a is 1 to 100 nm. Subsequently, as shown in FIG. 9B, an organic photodiode (PD) layer (organic photoelectric conversion layer) 452b is formed on the oxide semiconductor layer 454b on the insulating layer 456b. The film thickness of the organic photodiode (PD) layer 452b is 10 to 500 nm.

Next, as shown in FIG. 9C, a work function control layer 458c containing an oxide containing molybdenum and at least one metal element other than molybdenum (for example, InMoOx (IMO)) is formed on the organic photodiode (PD) layer 452c. The film thickness of the work function control layer 458c is 0.1 to 30 nm. Note that the organic photodiode (PD) layer 452c is formed on the oxide semiconductor layer 454c on the insulating layer 456c.

As shown in FIG. 9D, radical oxidation treatment is performed on the work function control layer 458d. The work function control layer 458d is formed on the organic photodiode (PD) layer 452d. The organic photodiode (PD) layer 452d is formed on the oxide semiconductor layer 454d on the insulating layer 456d.

Lastly, as shown in FIG. 9E, an upper transparent electrode layer (first electrode) 451e is formed as a film on the work function control layer 458e containing a molybdenum (Mo) oxide by sputtering. Note that the work function control layer 458e is formed on the organic photodiode (PD) layer 452e. The organic photodiode (PD) layer 452e is formed on the oxide semiconductor layer 454e on the insulating layer 456e.

5. Fourth Embodiment (Example 4 of Photoelectric Conversion Element)

A photoelectric conversion element of a fourth embodiment according to the present technology (example 4 of the photoelectric conversion element) is a photoelectric conversion element that includes at least a first electrode, a work function control layer, a photoelectric conversion layer, an oxide semiconductor layer, and a second electrode in this order and further includes a third electrode, in which the third electrode is provided apart from the second electrode and is provided facing the photoelectric conversion layer via an insulating layer, the work function control layer contains an oxide containing molybdenum and at least one metal element other than molybdenum, and an auxiliary layer is further provided between the first electrode and the work function control layer. The auxiliary layer has the effect of preventing damage to the work function control layer due to sputtering or the like used for the fabrication of the first electrode (an upper electrode) provided thereon, and further has the effect of not impairing the control function (electronic function) of the work function control layer. As long as these two effects are exhibited, the auxiliary layer may contain arbitrary materials; for example, the auxiliary layer may contain a non-oxide material or an oxide material, and may employ, for example, HATCN, an oxide material not having insulating properties (a thin film of $SiO_2$), etc.

According to the photoelectric conversion element of the fourth embodiment according to the present technology, image quality (the quality of captured images) can be improved by an oxide containing molybdenum and at least one metal element other than molybdenum being contained in the work function control layer. In more detail, since the oxide containing molybdenum and at least one metal element other than molybdenum contained in the work function control layer of the photoelectric conversion element of the fourth embodiment according to the present technology is chemically stable as compared to a molybdenum oxide (for example, a molybdenum oxide of a stoichiometric composition, or an oxide containing only low-valent (for example, tetravalent or pentavalent) molybdenum), the oxide does not experience the generation of hydrogen upon coming into contact with water, which may make interaction in a later step, and does not influence the characteristics of the oxide semiconductor layer. Further, even if at least one metal element other than molybdenum is contained in the oxide, the characteristics of the photoelectric conversion element (the work function control layer) are not impaired.

In the photoelectric conversion element of the fourth embodiment according to the present technology, it is preferable that the amount of at least one metal element other than molybdenum contained in the oxide be larger than the amount of molybdenum contained in the oxide; by this preferred manner, the oxide is likely to be formed such that at least one metal element surrounds molybdenum, and forms a more chemically stable structure. Then, this more chemically stable oxide can suppress the generation of hydrogen caused by oxidation of molybdenum (Mo) more.

The ratio (content amount ratio) between the content amount of at least one metal element other than molybdenum and the content amount of molybdenum in the oxide may be optional in terms of molar ratio (the mol of at least one metal element other than molybdenum:the mol of molybdenum), but is preferably 6.7:3.3 to 7.3:2.7, and more preferably 7:3. As a preferred oxide, for example, the molar ratio between indium (In) and molybdenum (Mo) is 7:3 (In:Mo). Note that, if the content amount of indium (In) in the oxide is too large, the energy level may be unfit, and if the content amount of indium (In) is too small, the effect of chemical stability may be weakened. Thus, it is presumed that the energy level and the effect of chemical stability are in a trade-off relation.

In the photoelectric conversion element of the fourth embodiment according to the present technology, the at least one metal element other than molybdenum is preferably a metal element of group 12 of the periodic table, a metal element of group 13 of the periodic table, or a metal element of group 14 of the periodic table. Examples of the metal element of group 12 of the periodic table include zinc (Zn), cadmium (Cd), and mercury (Hg). Examples of the metal element of group 13 of the periodic table include aluminum (Al), gallium (Ga), indium (In), and thallium (Tl), among which indium (In) is preferable. Further, examples of preferred oxides include InMoOx (IMO) with a large electron affinity. Moreover, if the amount of oxygen in InMoOx (IMO) is increased (the partial pressure of oxygen is raised), the electron affinity is increased, and a function as a work function control layer is achieved more easily. Examples of the metal element of group 14 of the periodic table include germanium (Ge), tin (Sn), and lead (Pb).

The photoelectric conversion element of the fourth embodiment according to the present technology may further include a p-type buffer layer between the work function control layer and the photoelectric conversion layer, and may further include an n-type buffer layer between the photoelectric conversion layer and the oxide semiconductor layer.

The photoelectric conversion element of the fourth embodiment according to the present technology can be manufactured by using a known method, for example, the sputtering method, a method of performing patterning by photolithography technology and performing dry etching or wet etching, or a wet film formation method. Examples of the wet film formation method include the spin coating method, the immersion method, the casting method, various printing methods such as the screen printing method, the inkjet printing method, the offset printing method, and the gravure printing method, the stamping method, the spraying method, and various coating methods such as the air doctor coater method, the blade coater method, the rod coater method, the knife coater method, the squeeze coater method, the reverse roll coater method, the transfer roll coater method, the gravure coater method, the kiss coater method, the cast coater method, the spray coater method, the slit orifice coater method, and the calender coater method.

Hereinbelow, methods for manufacturing photoelectric conversion layers of the fourth embodiment according to the present technology are specifically described using FIGS. 10A, 10B, 10C, 10D, and 10E. FIGS. 10A, 10B, 10C, 10D, and 10E are cross-sectional view for describing methods for manufacturing photoelectric conversion elements of the fourth embodiment according to the present technology.

Method-1 for manufacturing a photoelectric conversion element of the fourth embodiment according to the present technology is described using FIGS. 10A, 10B, 10C, 10D, and 10E.

Figures 10A, 10B, 10C, 10D, 10E:
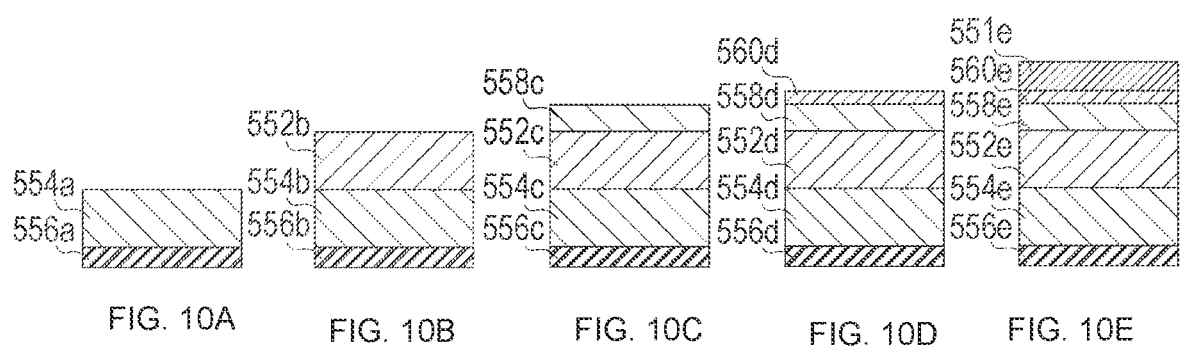
FIGS. 10A, 10B, 10C, 10D, and 10E are cross-sectional views for describing a method for manufacturing a photoelectric conversion element of a fourth embodiment to which the present technology is applied.

As shown in FIG. 10A, an oxide semiconductor layer 554*a* is formed on an insulating layer 556*a*. The film thickness of the oxide semiconductor layer 554*a* is 1 to 100 nm. Subsequently, as shown in FIG. 10B, an organic photodiode (PD) layer (organic photoelectric conversion layer) 552*b* is formed on the oxide semiconductor layer 554*b* on the insulating layer 556*b*. The film thickness of the organic photodiode (PD) layer 552*b* is 10 to 500 nm.

Next, as shown in FIG. 10C, a work function control layer 558*c* containing an oxide containing molybdenum and at least one metal element other than molybdenum (for example, InMoOx (IMO)) is formed on the organic photodiode (PD) layer 552*c*. The film thickness of the work function control layer 558*c* is 0.1 to 30 nm. Note that the organic photodiode (PD) layer 552*c* is formed on the oxide semiconductor layer 554*c* on the insulating layer 556*c*.

As shown in FIG. 10D, an auxiliary layer 560*d* (for example, an auxiliary layer 560*d* containing HATCN) is formed on the work function control layer 558d containing an oxide containing molybdenum and at least one metal element other than molybdenum (for example, InMoOx (IMO)). The film thickness of the auxiliary layer 560d is 0.1 to 30 nm. The work function control layer 558d is formed on the organic photodiode (PD) layer 552d. The organic photodiode (PD) layer 552d is formed on the oxide semiconductor layer 554d on the insulating layer 556d.

Finally, as shown in FIG. 10E, an upper transparent electrode layer (first electrode) 551e is formed as a film on the auxiliary layer 560e by sputtering. At this time, the auxiliary layer 560e serves as a damage buffer layer at the time of the formation of the upper transparent electrode 551e. The work function control layer 558e is formed on the organic photodiode (PD) layer 552e. The organic photodiode (PD) layer 552e is formed on the oxide semiconductor layer 554e on the insulating layer 556e.

For the photoelectric conversion element of the fourth embodiment according to the present technology, the matter described in the section of the photoelectric conversion element of the third embodiment according to the present technology (including the description regarding FIG. 6) can be applied as it is except for the above description.

6. Fifth Embodiment (Example of Solid-State Imaging Device)

A solid-state imaging device of a fifth embodiment according to the present technology is a solid-state imaging device in which at least one or a plurality of photoelectric conversion elements of any one embodiment of the first embodiment to the fourth embodiment and a semiconductor substrate are stacked for each of a plurality of one-dimensionally or two-dimensionally arranged pixels. Image quality (the quality of captured images) can be improved by the solid-state imaging device of the fifth embodiment according to the present technology.

Figure 11:
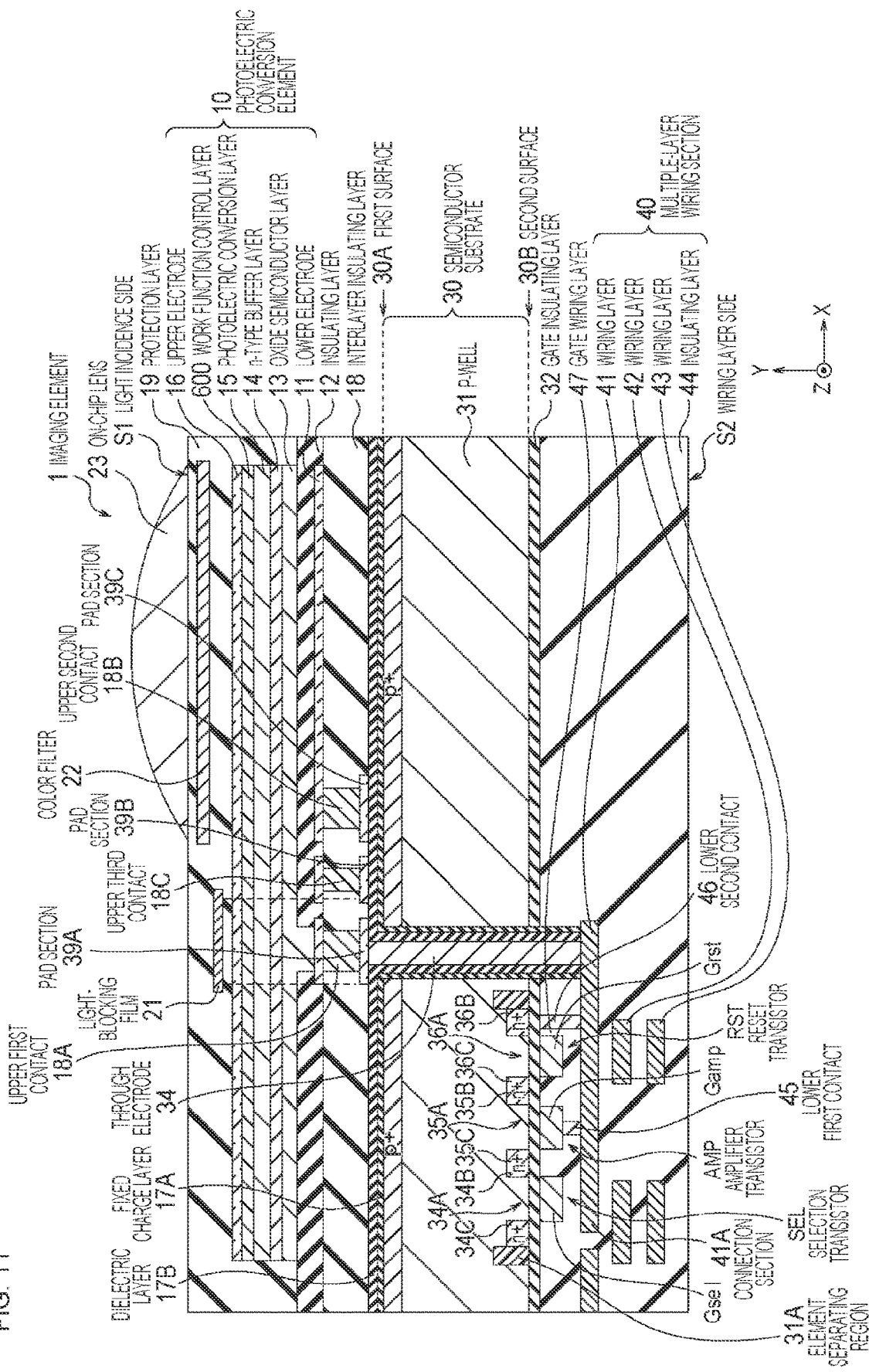
FIG. 11 is a schematic cross-sectional view of an imaging element included in a solid-state imaging device of a fifth embodiment to which the present technology is applied.
Figure 12:
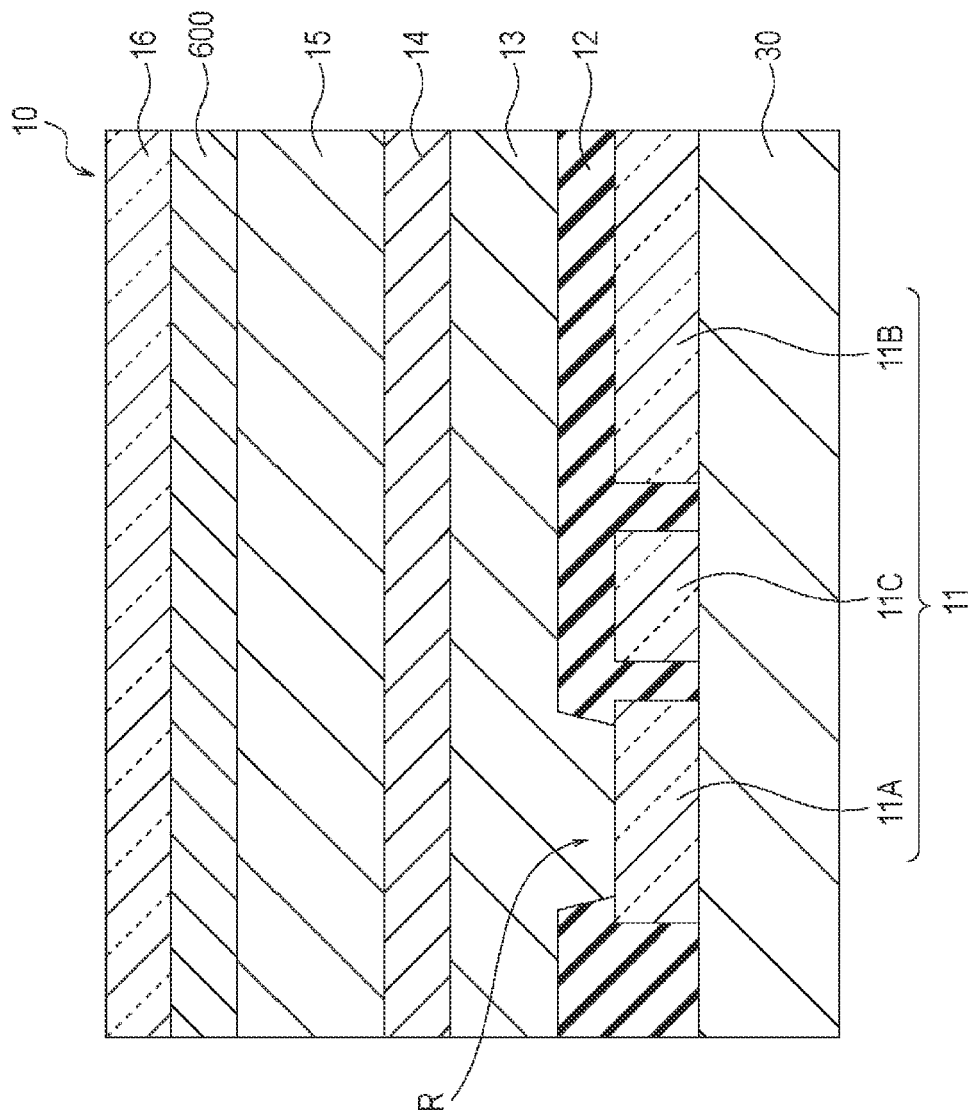
FIG. 12 is a schematic cross-sectional view of the photoelectric conversion element shown in FIG. 11.

FIG. 11 schematically shows a cross-sectional configuration of an imaging element 1 included in a solid-state imaging device of the fifth embodiment according to the present technology. FIG. 12 schematically shows an enlarged view of a cross-sectional configuration of a main part (a photoelectric conversion element 10) of the imaging element 1 shown in FIG. 11. The photoelectric conversion element 10 may be a photoelectric conversion element of the first embodiment, may be a photoelectric conversion element of the second embodiment, may be a photoelectric conversion element of the third embodiment, or may be a photoelectric conversion element of the fourth embodiment. When the photoelectric conversion element 10 is a photoelectric conversion element of the second embodiment, it is possible to understand that an auxiliary layer is omitted in FIG. 12. The imaging element 1 is included in, for example, one pixel (a unit pixel P) in an imaging device such as a CMOS image sensor (an imaging device 1001, see FIG. 13).

(Configuration of Imaging Element)

The imaging element 1 is, for example, an element in which the photoelectric conversion element 10 is provided on the side of a first surface (the back surface) 30A of a semiconductor substrate 30. The photoelectric conversion element 10 includes, between a lower electrode 11 and an upper electrode (first electrode) 16 arranged facing each other, a photoelectric conversion layer 15 formed using semiconductor nanoparticles. Between the lower electrode 11 and the photoelectric conversion layer 15, a charge accumulation layer (oxide semiconductor layer) 13 is provided via an insulating layer (occasionally referred to as a first insulating layer) 12. The lower electrode 11 includes, as a plurality of mutually independent electrodes, a readout electrode (second electrode) 11A, an accumulation electrode (third electrode) 11B, and a transfer electrode 11C that is placed between, for example, the second electrode 11A and the third electrode 11B, the third electrode 11B and the transfer electrode 11C are covered by the insulating layer 12, and the second electrode 11A is electrically connected to the oxide semiconductor layer 13 via an opening R (FIG. 12) provided in the insulating layer 12. In the present embodiment, the photoelectric conversion element 10 has a configuration in which an n-type buffer layer 14 is provided between the oxide semiconductor layer 13 and the photoelectric conversion layer 15.

Note that the present embodiment describes a case where an electron out of a pair of an electron and a hole (an electron-hole pair) generated by photoelectric conversion is read out as a signal charge. Further, in the drawing, "+(plus)" attached to "p" or "n" indicates that the impurity concentration of the p-type or the n-type is high, and "++" indicates that the impurity concentration of the p-type or the n-type is still higher than that of "+".

The photoelectric conversion element 10 is a photoelectric conversion element that absorbs light corresponding to the wavelength range of part or the whole of a selective wavelength range (for example, not less than 400 nm and not more than 2500 nm) and generates an electron-hole pair. As shown in FIG. 12, the photoelectric conversion element 10 has a configuration in which, for example, the lower electrode 11, the insulating layer 12, the oxide semiconductor layer 13, the n-type buffer layer 14, the photoelectric conversion layer 15, and the upper electrode (first electrode) 16 are stacked in this order on the first surface 30A side of the semiconductor substrate 30. Note that FIG. 12 is shown while a fixed charge layer 17A, a dielectric layer 17B, an interlayer insulating layer 18, etc. are omitted. The lower electrode 11 is, for example, formed separately for each unit pixel P, and includes the readout electrode (second electrode) 11A, the accumulation electrode (third electrode) 11B, and the transfer electrode 11C that are mutually separated via the insulating layer 12, details of which are described later. Although FIG. 11 shows an example in which the oxide semiconductor layer 13, the n-type buffer layer 14, the photoelectric conversion layer 15, and the upper electrode (first electrode) 16 are formed separately for each imaging element 1, these may be provided as a continuous layer common to a plurality of imaging elements 1, for example.

As mentioned above, the lower electrode 11 includes, for example, the readout electrode (second electrode) 11A, the accumulation electrode (third electrode) 11B, and the transfer electrode 11C that are mutually independent. The lower electrode 11 may contain, for example, an electrically conductive material having light transmissivity (a transparent electrically conductive material). The band gap energy of the transparent electrically conductive material is, for example, preferably not less than 2.5 eV, and desirably not less than 3.1 eV. A metal oxide may be given as the transparent electrically conductive material. Specific examples include indium oxide, an indium-tin oxide (ITO, indium tin oxide, including Sn-doped $In_2O_3$, crystalline ITO, and amorphous ITO), an indium-zinc oxide (IZO, indium zinc oxide) in which indium is added as a dopant to zinc oxide, an indium-gallium oxide (IGO) in which indium is added as a dopant to gallium oxide, an indium-gallium-zinc oxide (IGZO, In—$GaZnO_4$) in which indium and gallium are added as dopants to zinc oxide, an indium-tin-zinc oxide (ITZO) in which indium and tin are added as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with other elements), an aluminum-zinc oxide (AZO) in which aluminum is added as a dopant to zinc oxide, a gallium-zinc oxide (GZO) in which gallium is added as a dopant to zinc oxide, titanium oxide ($TiO_2$), a niobium-titanium oxide (TNO) in which niobium is added as a dopant to titanium oxide, antimony oxide, a spinel-type oxide, and an oxide having a $YbFe_2O_4$ structure. In addition, a transparent electrode using a gallium oxide, a titanium oxide, a niobium oxide, a nickel oxide, or the like as a base layer may be given. The film thickness in the Y-axis direction (hereinafter, simply referred to as the thickness) of the lower electrode 11 is, for example, not less than $2\times10^{-8}$ m and not more than $2\times10^{-7}$ m, and preferably not less than $3\times10^{-8}$ m and not more than $1\times10^{-7}$ m.

Note that, in a case where transparency is unnecessary for the lower electrode 11, the lower electrode 11 may be formed as, for example, a single-layer film or a stacked film using a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo), or an alloy of them. Specifically, the lower electrode 11 may be formed using Al—Nd (an alloy of aluminum and neodymium), ASC (an alloy of aluminum, samarium, and copper), or the like. Further, the lower electrode 11 may be formed using an electrically conductive material such as electrically conductive particles containing any of the metals mentioned above or an alloy of them, polysilicon containing an impurity, a carbon-based material, an oxide semiconductor material, carbon nanotubes, or graphene. In addition, the lower electrode 11 may be formed using an organic material (electrically conductive high molecules) such as poly(3,4-ethylenedioxythiophene)/polystyrene sulfonate [PEDOT/PSS], or may be formed by mixing any of these electrically conductive materials with a binder (high molecules) into paste or ink and hardening the paste or the ink.

The readout electrode (second electrode) 11A is an electrode for transferring a signal charge generated in the photoelectric conversion layer 15 to a floating diffusion section FD1. The readout electrode (third electrode) 11A is, for example, connected to the floating diffusion section FD1 provided on the side of a second surface (the front surface) 30B of the semiconductor substrate 20, via an upper first contact 18A, a pad section 39A, a through electrode 34, a connection section 41A, and a lower second contact 46.

The accumulation electrode (third electrode) 11B is an electrode for accumulating, in the oxide semiconductor layer 13, a signal charge (electrons) out of the charges generated in the photoelectric conversion layer 15. The accumulation electrode (third electrode) 11B is preferably larger than the readout electrode (second electrode) 11A, and can thereby accumulate a large amount of charge.

The transfer electrode 11C is an electrode for improving the efficiency of transfer of charge accumulated in the accumulation electrode (third electrode) 11B to the readout electrode (third electrode) 11A, and is provided between the readout electrode (second electrode) 11A and the accumulation electrode (third electrode) 11B. The transfer electrode 11C is, for example, connected to a pixel driving circuit included in a driving circuit via an upper third contact 18C and a pad section 39C. The readout electrode (second electrode) 11A, the accumulation electrode (third electrode) 11B, and the transfer electrode 11C can apply voltage independently of each other.

The insulating layer 12 is a layer for electrically separating the accumulation electrode (third electrode) 11B and the transfer electrode 11C, and the oxide semiconductor layer 13. The insulating layer 12 is, for example, provided on an interlayer insulating layer 18 so as to cover the lower electrode 11. Further, in the insulating layer 12, an opening R is provided on the readout electrode (second electrode) 11A of the lower electrode 11, and the readout electrode (second electrode) 11A and the oxide semiconductor layer 13 are electrically connected via the opening R. The side surface of the opening R preferably has, for example, an inclination expanding toward the light incidence side S1, as shown in FIG. 12. Thereby, the movement of charge from the oxide semiconductor layer 13 to the readout electrode (second electrode) 11A is smoothed.

As the material of the insulating layer 12, inorganic-based insulating materials such as silicon oxide-based materials, silicon nitride ($SiN_x$), and metal oxide high-dielectric insulating materials such as aluminum oxide ($Al_2O_3$) are given. In addition, organic-based insulating materials (organic polymers), examples including polymethyl methacrylate (PMMA), polyvinylphenol (PVP), polyvinyl alcohol (PVA), polyimides, polycarbonates (PC), polyethylene terephthalate (PET), polystyrene, silanol derivatives (silane coupling agents) such as N-2-(aminoethyl)-3-aminopropyltrimethoxysilane (AEAPTMS), 3-mercaptopropyltrimethoxysilane (MPTMS), and octadecyltrichlorosilane (OTS), novolak-type phenolic resins, fluorine-based resins, and a straight-chain hydrocarbon having, at one end, a functional group capable of binding to a control electrode, such as octadecanethiol and dodecyl isocyanate, may be given, and these may be used in combination. Note that, as silicon oxide-based materials, silicon oxide ($SiO_x$), BPSG, PSG, BSG, AsSG, PbSG, silicon oxynitride (SiON), SOG (spin-on glass), and low-permittivity materials (for example, polyaryl ethers, cycloperfluorocarbon polymers, benzocyclobutene, cyclic fluororesins, polytetrafluoroethylene, fluorinated aryl ethers, fluorinated polyimides, amorphous carbon, and organic SOG) are given.

The oxide semiconductor layer 13 is a layer for accumulating a signal charge generated in the photoelectric conversion layer 15 and transferring the signal charge to the readout electrode (second electrode) 11A. The oxide semiconductor layer 13 preferably uses a material that has a higher mobility of charge than the photoelectric conversion layer 15 and yet has a large band gap. Thereby, for example, the speed of charge transfer can be improved, and the injection of holes from the readout electrode (second electrode) 11A to the oxide semiconductor layer 13 is suppressed.

The oxide semiconductor layer 13 may contain an oxide semiconductor material. Examples of the oxide semiconductor material include IGZO (an In—Ga—Zn—O-based oxide semiconductor), ZTO (a Zn—Sn—O-based oxide semiconductor), IGZTO (an In—Ga—Zn—Sn—O-based oxide semiconductor), GTO (a Ga—Sn—O-based oxide semiconductor), and IGO (an In—Ga—O-based oxide semiconductor). The oxide semiconductor layer preferably uses at least one of the oxide semiconductor materials mentioned above, and preferably uses, among them, IGZO. Further, examples of materials to be contained in the oxide semiconductor layer 104 include transition metal dichalcogenides, silicon carbide, diamond, graphene, carbon nanotubes, and organic semiconductor materials such as condensed polycyclic hydrocarbon compounds and condensed heterocyclic compounds.

The thickness of the oxide semiconductor layer 13 is, for example, not less than 30 nm and not more than 200 nm, and preferably not less than 60 nm and not more than 150 nm.

The n-type buffer layer 14 is a layer for promoting the supply of electrons generated by the photoelectric conversion layer 15 to the lower electrode 11 (readout electrode (second electrode) 11A and the accumulation electrode (third electrode) 11B, and may contain, for example, titanium oxide ($TiO_2$), zinc oxide (ZnO), or the like. The n-type buffer layer 103 may be formed also by stacking titanium oxide and zinc oxide. Further, the n-type buffer layer 103 may contain a high-molecular semiconductor material or an organic-based material such as a material that is an organic molecule or an organic metal complex including a heterocycle including N as part of the molecular framework, such as pyridine, quinoline, acridine, indole, imidazole, benzimidazole, or phenanthroline, and that has limited absorption in the visible light region.

The imaging elements 1 may include p-type buffer layer. The p-type buffer layer is a layer for promoting the supply of holes generated by the photoelectric conversion layer 15 to the upper electrode (first electrode) 16, and may contain, for example, molybdenum oxide ($MoO_3$), nickel oxide (NiO), vanadium oxide ($V_2O_5$), or the like. The p-type buffer layer (hole transportation layer) may contain an organic material such as poly(3,4-ethylenedioxythiophene) (PEDOT), N,N'-bis(3-methylphenyl)-N,N'-diphenylbenzidine (TPD), or 4,4',4"-tris[2-naphthyl(phenyl)amino]triphenylamine (2T-NATA).

The upper electrode (first electrode) 16 contains an electrically conductive material having light transmissivity. The upper electrode (first electrode) 16 may be separated for each unit pixel P, or may be formed as an electrode common to unit pixels P. The thickness of the upper electrode (first electrode) 16 is, for example, 10 nm to 200 nm.

In the photoelectric conversion element 10 of the present embodiment, near-infrared light L incident on the photoelectric conversion element 10 from the upper electrode (first electrode) 16 side is absorbed by the photoelectric conversion layer 15. An exciton thus generated experiences exciton separation, and dissociates into an electron and a hole. The charges generated here (electrons and holes) are carried to different electrodes by diffusion caused by the difference between the concentrations of carriers or due to an internal electric field caused by the difference in work function between the positive pole (herein, the upper electrode (first electrode) 16) and the negative pole (herein, the lower electrode 11). The directions of transportation of electrons and holes are controlled by applying an electric potential between the lower electrode 11 and the upper electrode (first electrode) 16. Herein, electrons are carried as a signal charge to the lower electrode 11 side. The electrons carried to the lower electrode 11 side are accumulated in the oxide semiconductor layer 13 on the accumulation electrode (second electrode) 11B, are then transferred toward the readout electrode (third electrode) 11A, and are detected as a photoelectric current.

On the second surface 30B of the semiconductor substrate 30, for example, a floating diffusion section (floating diffusion layer) FD1 (region 36B in the semiconductor substrate 30), an amplifier transistor (modulation element) AMP, a reset transistor RST, a selection transistor SEL, and a multiple-layer wiring section 40 are provided. The multiple-layer wiring section 40 has a configuration in which, for example, wiring layers 41, 42, and 43 are stacked in an insulating layer 44.

Note that, in the drawing, the first surface 30A side of the semiconductor substrate 30 is shown as the light incidence side S1 and the second surface 30B side is shown as the wiring layer side S2.

Between the first surface 30A of the semiconductor substrate 30 and the lower electrode 11, for example, a layer (fixed charge layer) 17A having a fixed charge, a dielectric layer 17B having insulating properties, and an interlayer insulating layer 18 are provided. A protection layer 19 is provided on the upper electrode (first electrode) 16. In the protection layer 19, for example, a light-blocking film 21 is provided on, for example, the readout electrode (second electrode) 11A. The light-blocking film 21A at least does not cover the accumulation electrode (third electrode) 11B, and needs only to be provided so as to cover at least a region of the readout electrode (second electrode) 11A directly in contact with the photoelectric conversion layer 15. For example, the light-blocking film 21A is preferably provided to have a larger size than the readout electrode (second electrode) 11A formed in the same layer as the accumulation electrode (third electrode) 11B. Further, for example, a color filter 22 is provided on, for example, the accumulation electrode (third electrode) 11B. The color filter 22 is, for example, a filter for preventing the incidence of visible light on the photoelectric conversion layer 15, and needs only to be provided so as to cover at least the region of the accumulation electrode (third electrode) 11B. Note that, although FIG. 11 shows an example in which the light-blocking film 21 and the color filter 22 are provided in different positions in the film thickness direction of the protection layer 19, they may be provided in the same position. A flattening layer (not illustrated) and an optical member such as an on-chip lens 23 are provided above the protection layer 19.

The fixed charge layer 17A may be a film having a positive fixed charge, or may be a film having a negative fixed charge. As the material of the film having a negative fixed charge, hafnium oxide, aluminum oxide, zirconium oxide, tantalum oxide, titanium oxide, and the like are given. Further, as materials other than the above, also lanthanum oxide, praseodymium oxide, cerium oxide, neodymium oxide, promethium oxide, samarium oxide, europium oxide, gadolinium oxide, terbium oxide, dysprosium oxide, oxidizing holes, thulium oxide, ytterbium oxide, lutetium oxide, yttrium oxide, an aluminum nitride film, a hafnium oxynitride film, an aluminum oxynitride film, and the like may be used.

The fixed charge layer 17A may have a configuration in which two or more kinds of films are stacked. Thereby, for example, in a case of a film having a negative fixed charge, a function as a hole accumulation layer can be further enhanced.

The material of the dielectric layer 17B is not particularly limited, and the dielectric layer 17B includes, for example, a silicon oxide film, TEOS, a silicon nitride film, a silicon oxynitride film, or the like.

The interlayer insulating layer (occasionally referred to as a second insulating layer) 18 includes, for example, a single-layer film containing one of silicon oxide, silicon nitride, silicon oxynitride (SiON), and the like or a stacked film containing two or more of these.

The protection layer 19 contains a material having light transmissivity, and includes, for example, a single-layer film containing any of silicon oxide, silicon nitride, silicon oxynitride, and the like or a stacked film containing two or more of these. The thickness of the protection layer 19 is, for example, 100 nm to 30000 nm.

The through electrode 34 is provided between the first surface 30A and the second surface 30B of the semiconductor substrate 30. The photoelectric conversion element 10 is connected via the through electrode 34 to a gate Gamp of the amplifier transistor AMP and one source/drain region 36B of the reset transistor RST (a reset transistor Tr1*rst*) serving also as the floating diffusion section FD1. Thereby, in the imaging element 1, a signal charge generated by the photoelectric conversion element 10 on the first surface 30A side of the semiconductor substrate 30 is well transferred to the second surface 30B side of the semiconductor substrate 30 via the through electrode 34, and characteristics can be enhanced.

The lower end of the through electrode 34 is connected to the connection section 41A in the wiring layer 41, and the connection section 41A and the gate Gamp of the amplifier transistor AMP are connected via a lower first contact 45. The connection section 41A and the floating diffusion section FD1 (region 36B) are, for example, connected via the lower second contact 46. The upper end of the through electrode 34 is, for example, connected to the readout electrode (third electrode) 11A via the pad section 39A and the upper first contact 18A.

The through electrode 34 has a function as a connector between the photoelectric conversion element 10, and the gate Gamp of the amplifier transistor AMP and the floating diffusion section FD1, and serves as a transmission path of charge (herein, electrons) generated in the photoelectric conversion element 10.

A reset gate Grst of the reset transistor RST is placed next to the floating diffusion section FD1 (one source/drain region 36B of the reset transistor RST). Thereby, the charge accumulated in the floating diffusion section FD1 can be reset by the reset transistor RST.

The semiconductor substrate 30 includes, for example, an n-type silicon (Si) substrate, and has a p-well 31 in a prescribed region. The amplifier transistor AMP, the reset transistor RST, the selection transistor SEL, etc. described above are provided on the second surface 30B of the p-well 31. Further, a peripheral circuit (not illustrated) including a logic circuit, etc. is provided in a peripheral portion of the semiconductor substrate 30.

The reset transistor RST (the reset transistor Tr1*rst*) is a transistor that resets a charge transferred from the photoelectric conversion element 10 to the floating diffusion section FD1, and includes, for example, a MOS transistor. Specifically, the reset transistor Tr1*rst* includes a reset gate Grst, a channel formation region 36A, and source/drain regions 36B and 36C. The reset gate Grst is connected to a reset line RST1, and one source/drain region 36B of the reset transistor Tr1*rst* serves also as the floating diffusion section FD1. The other source/drain region 36C included in the reset transistor Tr1*rst* is connected to a power source VDD.

The amplifier transistor AMP is a modulation element that modulates the amount of charge generated by the photoelectric conversion element 10 to voltage, and includes, for example, a MOS transistor. Specifically, the amplifier transistor AMP includes a gate Gamp, a channel formation region 35A, and source/drain regions 35B and 35C. The gate Gamp is connected to the readout electrode (third electrode) 11A and one source/drain region 36B of the reset transistor Tr1*rst* (the floating diffusion section FD1) via the lower first contact 45, the connection section 41A, the lower second contact 46, the through electrode 34, etc. Further, one source/drain region 35B shares a region with the other source/drain region 36C included in the reset transistor Tr1*rst*, and is connected to the power source VDD.

The selection transistor SEL (a selection transistor TR1*sel*) includes a gate Gsel, a channel formation region 34A, and source/drain regions 34B and 34C. The gate Gsel is connected to a selection line SEL1. Further, one source/drain region 34B shares a region with the other source/drain region 35C included in the amplifier transistor AMP, and the other source/drain region 34C is connected to a signal line (data output line) VSL1. The solid-state imaging device of the fifth embodiment according to the present technology can be manufactured by, for example, using a photoelectric conversion element of any one embodiment among a photoelectric conversion element of the first embodiment to a photoelectric conversion element of the fourth embodiment according to the present technology, in conformity with a known method for manufacturing a solid-state imaging device (for example, a method for manufacturing a solid-state imaging device described in Japanese Patent Application Laid-Open No. 2017-157816).

(Overall Configuration of Solid-State Imaging Device)

Figure 13:
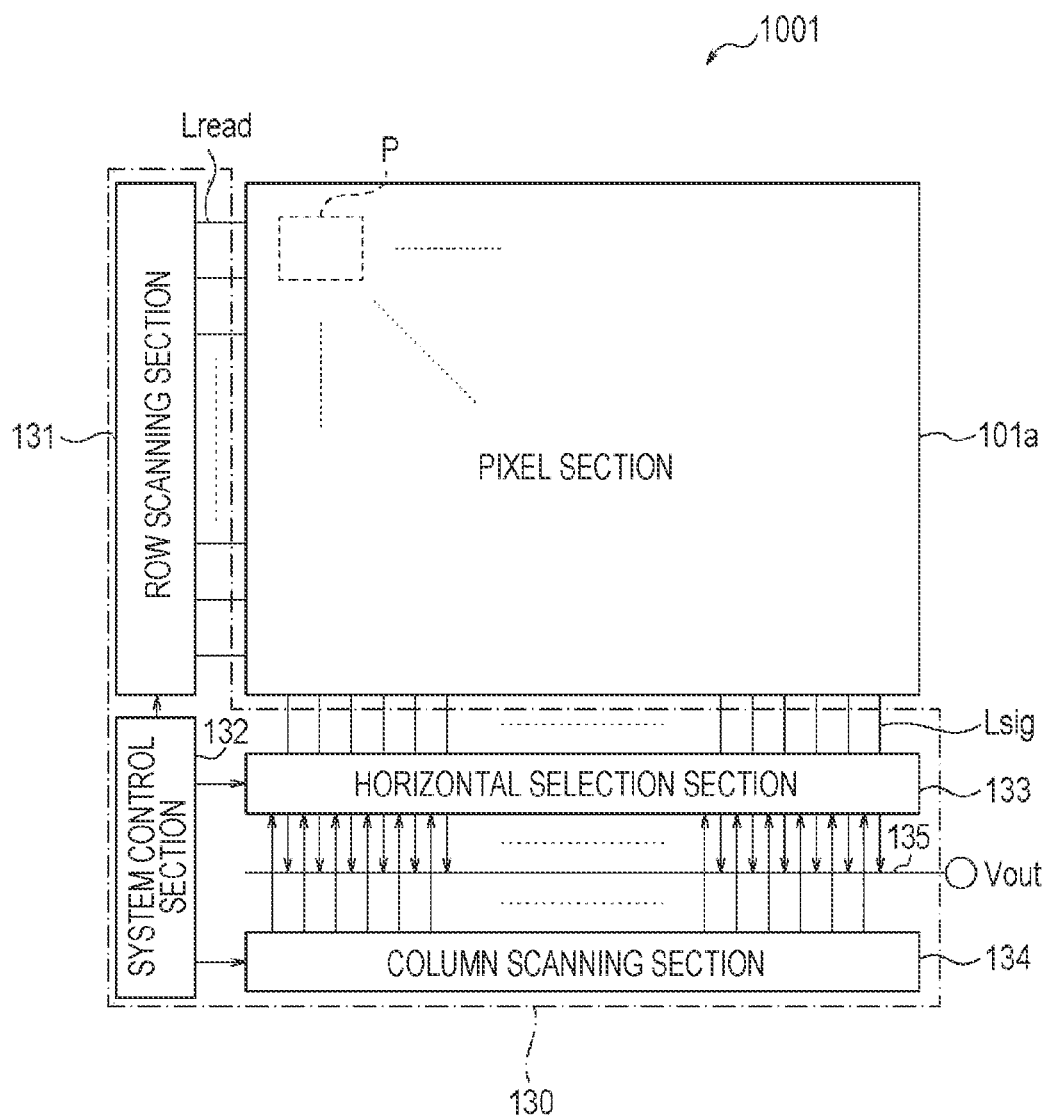
FIG. 13 is a block diagram showing a configuration of a solid-state imaging device of the fifth embodiment according to the present technology, which uses the imaging element shown in FIG. 11 as a pixel.

FIG. 13 is a functional block diagram showing a solid-state imaging device 1001. The solid-state imaging device 1001 is a CMOS image sensor and has a pixel section 101a as an imaging area, and has, for example, a circuit section 130 including a row scanning section 131, a horizontal selection section 133, a column scanning section 134, and a system control section 132. Provided in a region around the pixel section 1a or stacked with the pixel section 101a, the circuit section 130 may be provided in a region around the pixel section 101a, or may be provided to be stacked with the pixel section 101a (in a region facing the pixel section 101a).

The pixel section 101a has, for example, a plurality of unit pixels P (each of which corresponds to, for example, the imaging element 1 (serving as one pixel)) that are two-dimensionally arranged in a matrix form. In the unit pixel P, for example, a pixel driving line Lread (specifically, a row selection line and a reset control line) is drawn for each pixel row, and a vertical signal line Lsig is drawn for each pixel column. The pixel driving line Lread is a line that transmits a driving signal for reading out a signal sent from the pixel. One end of the pixel driving line Lread is connected to an output end corresponding to a row of the row scanning section 131.

The row scanning section 131 is a pixel driving unit that includes a shift register, an address decoder, etc. and that drives each pixel P of the pixel section 101a, for example on a row basis. Signals outputted from the pixels P of the pixel rows selectively scanned by the row scanning section 131 are supplied to the horizontal selection section 133 through the respective vertical signal lines Lsig. The horizontal selection section 133 includes amplifiers, horizontal selection switches, etc. provided individually for the vertical signal lines Lsig.

The column scanning section 134 is a section that includes a shift register, an address decoder, etc. and that sequentially scans and drives the horizontal selection switches of the horizontal selection section 133. By the selective scanning by the column scanning section 134, signals of the pixels transmitted through the vertical signal lines Lsig are sequentially transmitted to a horizontal signal line 135, and are outputted to the outside through the horizontal signal line 135.

The system control section 132 is a section that receives clocks given from the outside, data for issuing commands of operating modes, etc. and further outputs data of inside information of the solid-state imaging device 1001, etc. The system control section 132 further includes a timing generator that generates various timing signals, and performs the driving control of the row scanning section 131, the horizontal selection section 133, the column scanning section 134, etc., on the basis of various timing signals generated by the timing generator.

7. Sixth Embodiment (Example of Electronic Device)

An electronic device of a sixth embodiment according to the present technology is an electronic device that includes a solid-state imaging device of the fifth embodiment according to the present technology. The solid-state imaging device of the fifth embodiment according to the present technology is as mentioned above, and therefore herein a description is omitted. The electronic device of the sixth embodiment according to the present technology includes a solid-state imaging device having excellent image quality, and can therefore improve image quality properties, etc.

Hereinabove, a description is given using embodiments; however, the subject matter of the present technology is not limited to the above embodiments, but can be variously modified. For example, although the above embodiments show an example in which the photoelectric conversion element 10 is used alone in the imaging element 1, the photoelectric conversion element 10 may be used in combination with, for example, other photoelectric conversion elements that photoelectrically convert light of wavelengths other than the near-infrared region, such as visible light. Examples of other photoelectric conversion elements include what is called an inorganic photoelectric conversion element formed to be embedded in the semiconductor substrate 30 and what is called an organic photoelectric conversion element in which a photoelectric conversion layer is formed using an organic semiconductor material.

Further, although the above embodiments are described using, as an example, a configuration of a back-side illumination imaging element 1, the above embodiments can be applied also to a front-side illumination imaging element. Furthermore, in a case of use in combination with other photoelectric conversion elements as mentioned above, a configuration as an imaging element of what is called a vertical light separation type is possible, or a configuration in which photoelectric conversion elements that photoelectrically convert light in other wavelength ranges are two-dimensionally arranged (for example, in the Bayer arrangement) on a semiconductor substrate is possible. Furthermore, for example, a substrate provided with other functional elements such as a memory element may be stacked on the multiple-layer wiring side. Further, each of the photoelectric conversion element 10, the imaging element 1, and the imaging device 1001 according to the present technology does not need to include all the constituent elements described in the above embodiments, etc., and may include other layers conversely.

Figure 14:
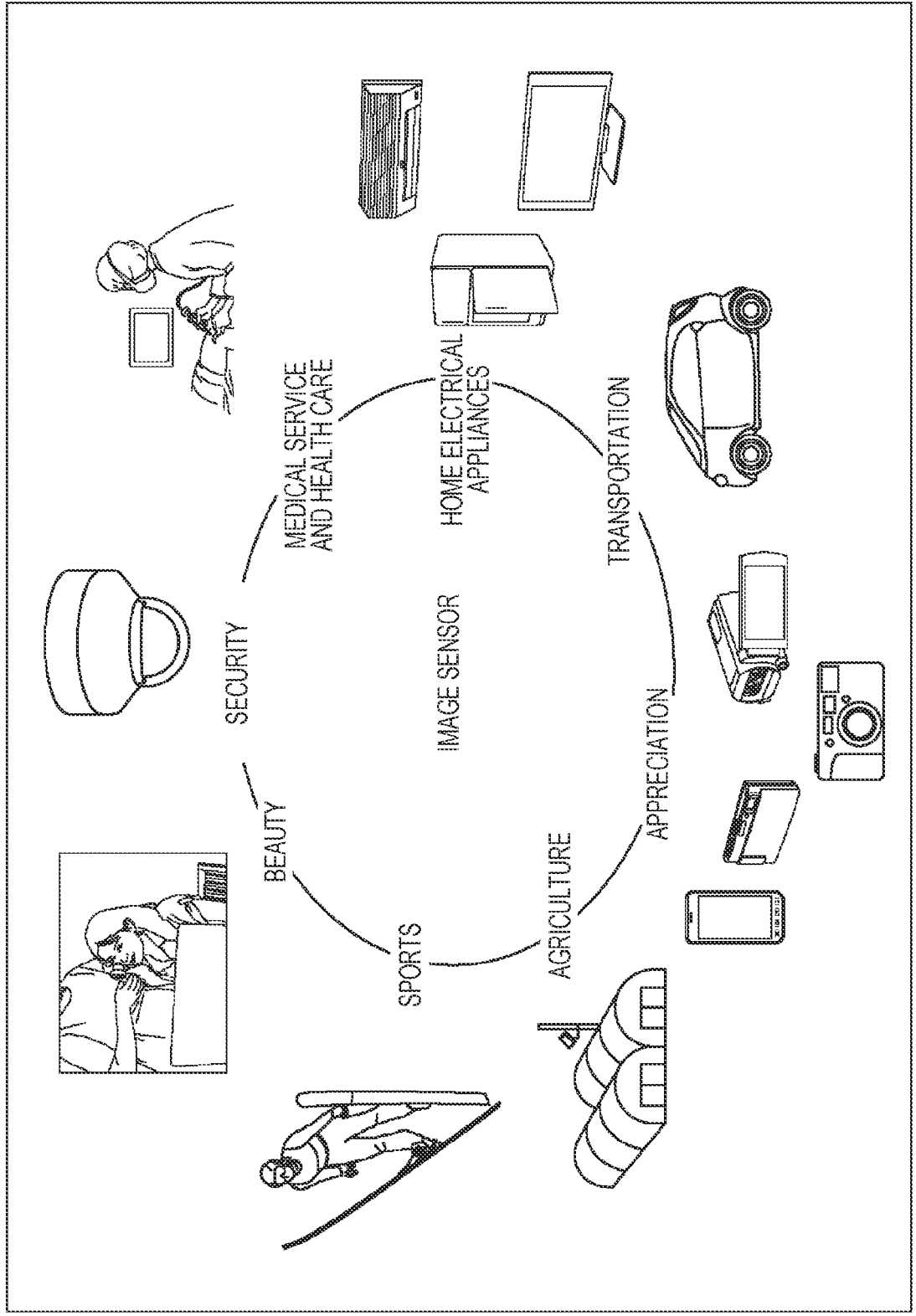
FIG. 14 is a diagram showing use examples of solid-state imaging devices to which the present technology is applied.

8. Use Examples of Solid-State Imaging Device to which Present Technology is Applied FIG. 14 is a diagram showing use examples of the solid-state imaging device of the fifth embodiment according to the present technology, as an image sensor.

The solid-state imaging device of the fifth embodiment described above can be used for, for example, various cases where light such as visible light, infrared light, ultraviolet light, or X-rays is sensed, as shown below. That is, as shown in FIG. 14, the solid-state imaging device of the fifth embodiment can be used for an apparatus (for example, the electronic device of the sixth embodiment described above) used in the field of appreciation in which images used for appreciation are imaged, the field of transportation, the field of home electrical appliances, the field of medical service and health care, the field of security, the field of beauty culture, the field of sports, the field of agriculture, etc., for example.

Specifically, in the field of appreciation, for example, the solid-state imaging device of the fifth embodiment can be used for an apparatus for capturing images used for appreciation, such as a digital camera, a smartphone, or a mobile phone provided with a camera function.

In the field of transportation, for example, the solid-state imaging device of the fifth embodiment can be used for an apparatus used for transportation for safe driving such as automatic stopping, the recognition of the state of a driver, etc., such as a car-mounted sensor that images the front side, the rear side, the surroundings, the inside, etc. of an automobile, a surveillance camera that monitors moving vehicles and a road, or a distance measuring sensor that performs distance measuring of the distance between vehicles or the like.

In the field of home electrical appliances, for example, the solid-state imaging device of the fifth embodiment can be used for an apparatus used for home electrical appliances in order to image a gesture of a user and perform device operation in accordance with the gesture, such as a television, a refrigerator, or an air conditioner.

In the field of medical service and health care, for example, the solid-state imaging device of the fifth embodiment can be used for an apparatus used for medical service and health care, such as an endoscope or an apparatus that performs blood vessel imaging by receiving infrared light.

In the field of security, for example, the solid-state imaging device of the fifth embodiment can be used for an apparatus used for security, such as a surveillance camera for crime prevention use or a camera for person authentication use.

In the field of beauty culture, for example, the solid-state imaging device of the fifth embodiment can be used for an apparatus used for beauty culture, such as a skin measuring device that images a skin or a microscope that images the scalp.

In the field of sports, for example, the solid-state imaging device of the fifth embodiment can be used for an apparatus used for sports, such as an action camera or a wearable camera for sports use or the like.

In the field of agriculture, for example, the solid-state imaging device of the fifth embodiment can be used for an apparatus used for agriculture, such as a camera for monitoring the state of a farm and crops.

Figure 15:
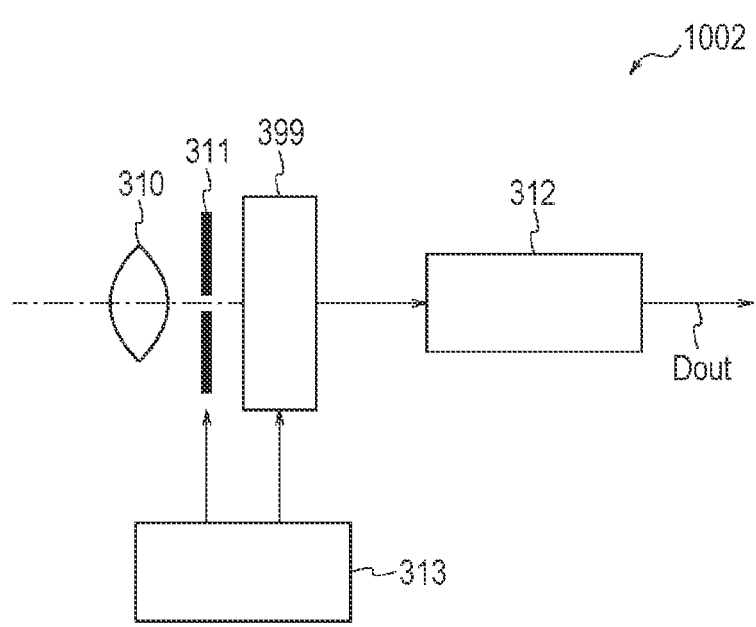
FIG. 15 is a functional block diagram of an example of an electronic device to which the present technology is applied.

Next, use examples of the solid-state imaging device of the fifth embodiment according to the present technology are specifically described. For example, the solid-state imaging device 1001 described above can be used for all types of electronic apparatuses including an imaging function, such as camera systems such as digital still cameras and video cameras, and mobile phones having an imaging function. FIG. 15 shows, as an example, a rough configuration of an electronic apparatus 1002 (a camera). The electronic apparatus 1002 is, for example, a video camera capable of capturing still images or moving images, and includes a solid-state imaging device 399, an optical system (optical lens) 310, a shutter device 311, a driving unit 313 that drives the solid-state imaging device 399 and the shutter device 311, and a signal processing section 312.

The optical system 310 is a system that guides image light (incidence light) sent from a subject to a pixel section of the solid-state imaging device 399. The optical system 310 may include a plurality of optical lenses. The shutter device 311 is a device that controls the period of light irradiation and the period of light blocking for the solid-state imaging device 399. The driving unit 313 is a section that controls a transfer operation of the solid-state imaging device 399 and a shutter operation of the shutter device 311. The signal processing section 312 is a section that performs various pieces of signal processing on a signal outputted from the solid-state imaging device 399. A video image signal Dout after signal processing is stored in a storage medium such as a memory, or is outputted to a monitor or the like.

9. Application Example to Endoscopic Surgery System

The present technology can be applied to various products. For example, the technology according to the present disclosure (present technology) can be applied to the endoscopic surgery system.

Figure 16:
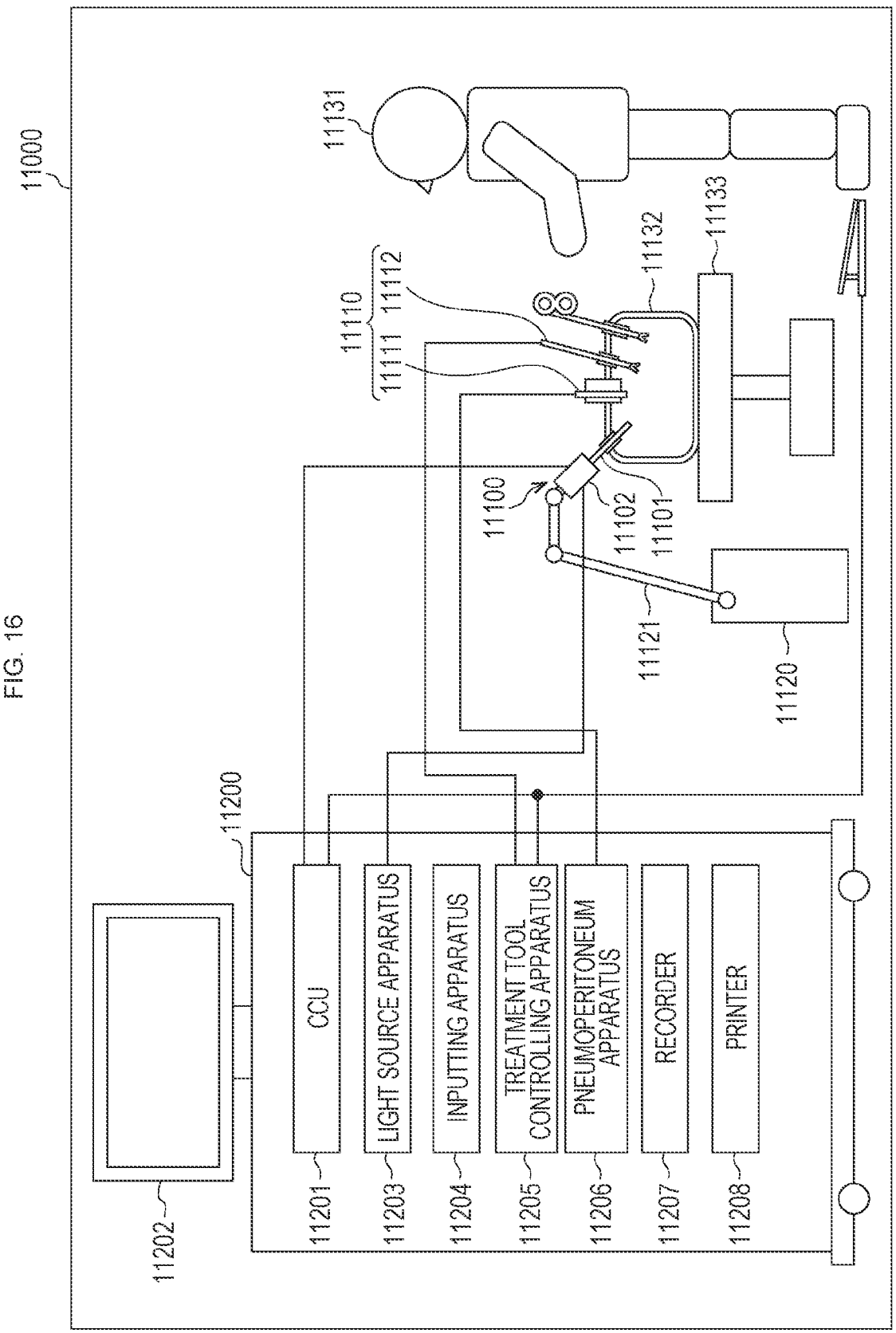
FIG. 16 is a view showing an example of a schematic configuration of an endoscopic surgery system.

FIG. 16 is a view showing an example of a schematic configuration of an endoscopic surgery system to which the technology according to an embodiment of the present disclosure (present technology) can be applied.

In FIG. 16, a state is illustrated in which a surgeon (medical doctor) 11131 is using an endoscopic surgery system 11000 to perform surgery for a patient 11132 on a patient bed 11133. As illustrated, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example illustrated, the endoscope 11100 is illustrated which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image capturing condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph. It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a captured image can be performed by the light source apparatus 11203. Further, in this case, if laser beams from the respective RGB laser light sources are irradiated time-divisionally on an observation target and driving of the imaging elements of the camera head 11102 are controlled in synchronism with the irradiation timings. Then images individually corresponding to the R, G and B colors can be also captured time-divisionally. According to this method, a color image can be obtained even if color filters are not provided for the imaging element.

Further, the light source apparatus 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 17:
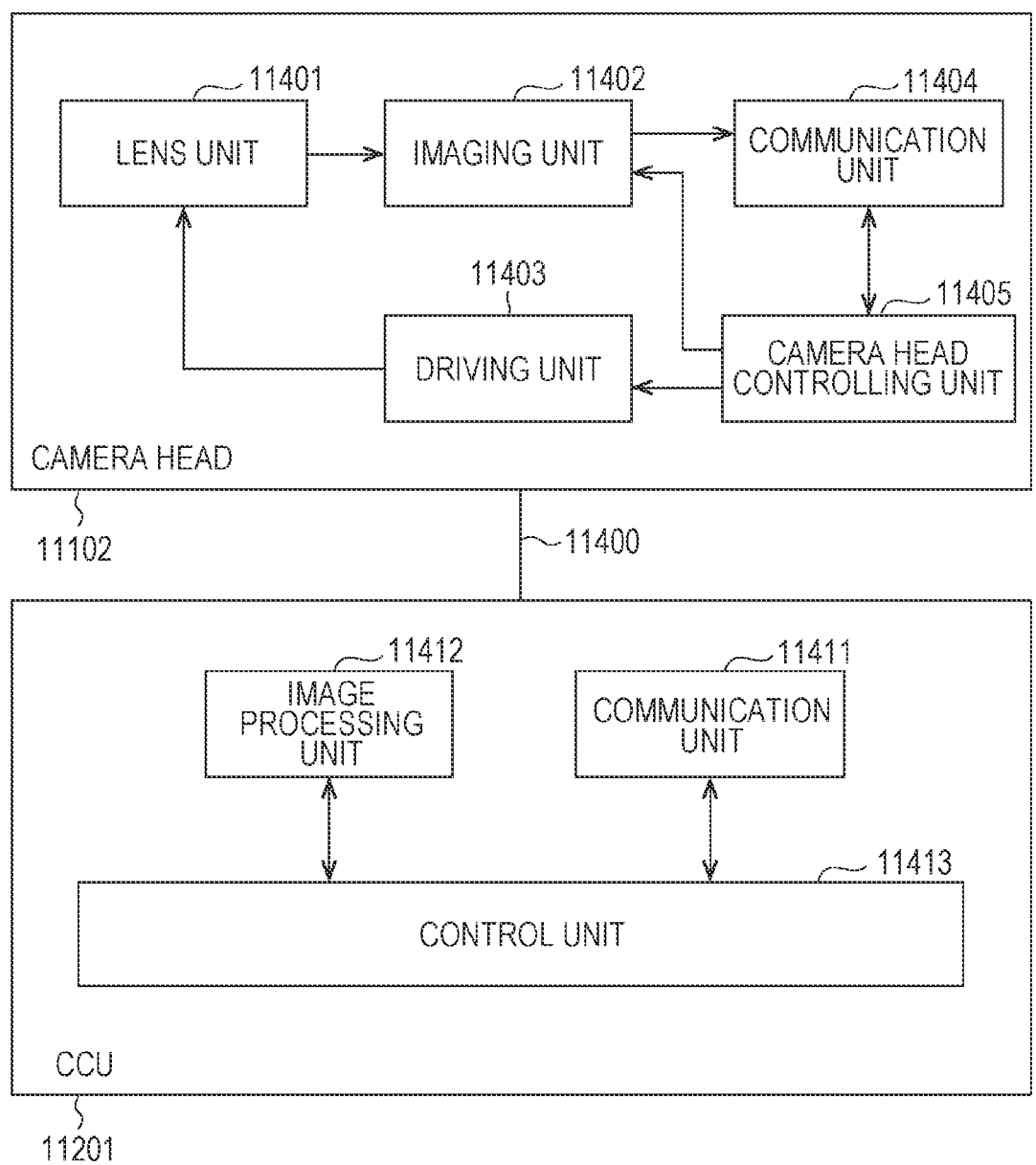
FIG. 17 is a block diagram showing an example of a functional configuration of a camera head and a camera control unit (CCU).

FIG. 17 is a block diagram showing an example of a functional configuration of the camera head 11102 and the CCU 11201 illustrated in FIG. 16.

The camera head 11102 includes a lens unit 11401, an imaging unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes imaging elements. The number of imaging elements which is included by the imaging unit 11402 may be one (single-plate type) or a plural number (multi-plate type). Where the imaging unit 11402 is configured as that of the multi-plate type, for example, image signals corresponding to respective R, G and B are generated by the imaging elements, and the image signals may be synthesized to obtain a color image. The imaging unit 11402 may also be configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the imaging unit 11402 is configured as that of stereoscopic type, a plurality of systems of lens units 11401 are provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a captured image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image capturing conditions such as, for example, information that a frame rate of a captured image is designated, information that an exposure value upon image capturing is designated and/or information that a magnification and a focal point of a captured image are designated.

It is to be noted that the image capturing conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image capturing of a surgical region or the like by the endoscope 11100 and display of a captured image obtained by image capturing of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a captured image in which the surgical region or the like is imaged. Thereupon, the control unit 11413 may recognize various objects in the captured image using various image recognition technologies. For example, the control unit 11413 can recognize a surgical tool such as forceps, a particular living body region, bleeding, mist when the energy device 11112 is used and so forth by detecting the shape, color and so forth of edges of objects included in a captured image. The control unit 11413 may cause, when it controls the display apparatus 11202 to display a captured image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example illustrated, communication is performed by wired communication using the transmission cable 11400, the communication between the camera head 11102 and the CCU 11201 may be performed by wireless communication.

Hereinabove, an example of an endoscopic surgery system to which the technology according to the present disclosure can be applied is described. The technology according to the present disclosure can be applied to, of the configuration described above, the endoscope 11100, (the imaging unit 11402 of) the camera head 11102, or the like. Specifically, the solid-state imaging device according to the present technology can be used for the imaging unit 10402. By applying the technology according to the present disclosure to the endoscope 11100, (the imaging unit 11402 of) the camera head 11102, or the like, properties of the endoscope 11100, (the imaging unit 11402 of) the camera head 11102, or the like can be improved.

Note that, although the endoscopic surgery system has been described as an example herein, the technology according to the present disclosure may also be applied to others, for example, a microscope surgery system, and the like.

10. Application Example to Mobile Bodies

The technology according to the present disclosure (present technology) can be applied to various products. For example, the technology according to the present disclosure may be implemented as apparatuses mounted on any type of mobile bodies such as automobiles, electric vehicles, hybrid electric vehicles, motorcycles, bicycles, personal mobilities, airplanes, drones, ships, and robots.

Figure 18:
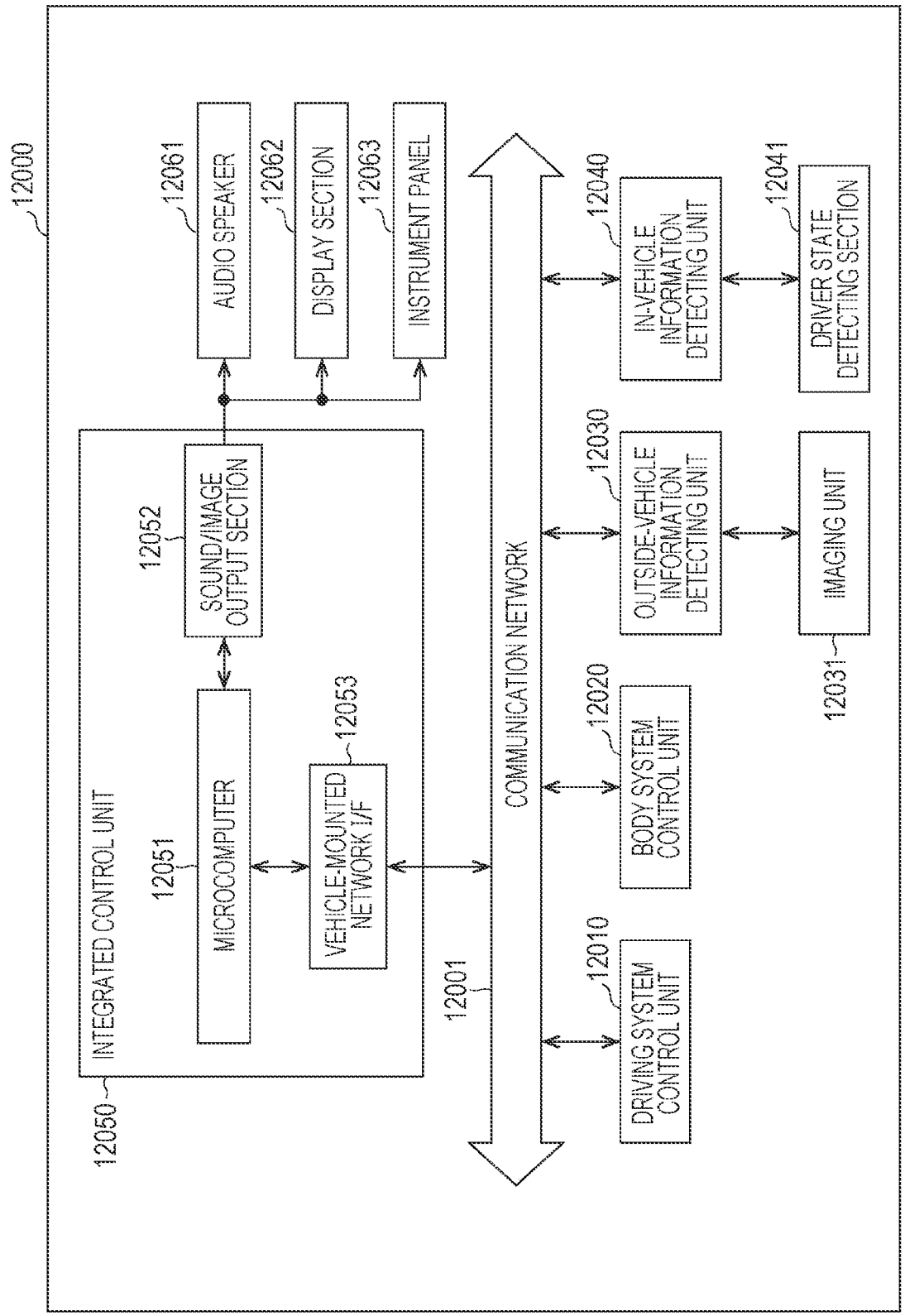
FIG. 18 is a block diagram showing an example of schematic configuration of a vehicle control system.

FIG. 18 is a block diagram showing an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example illustrated in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle. The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto. The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like. The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing. The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display or a head-up display.

Figure 19:
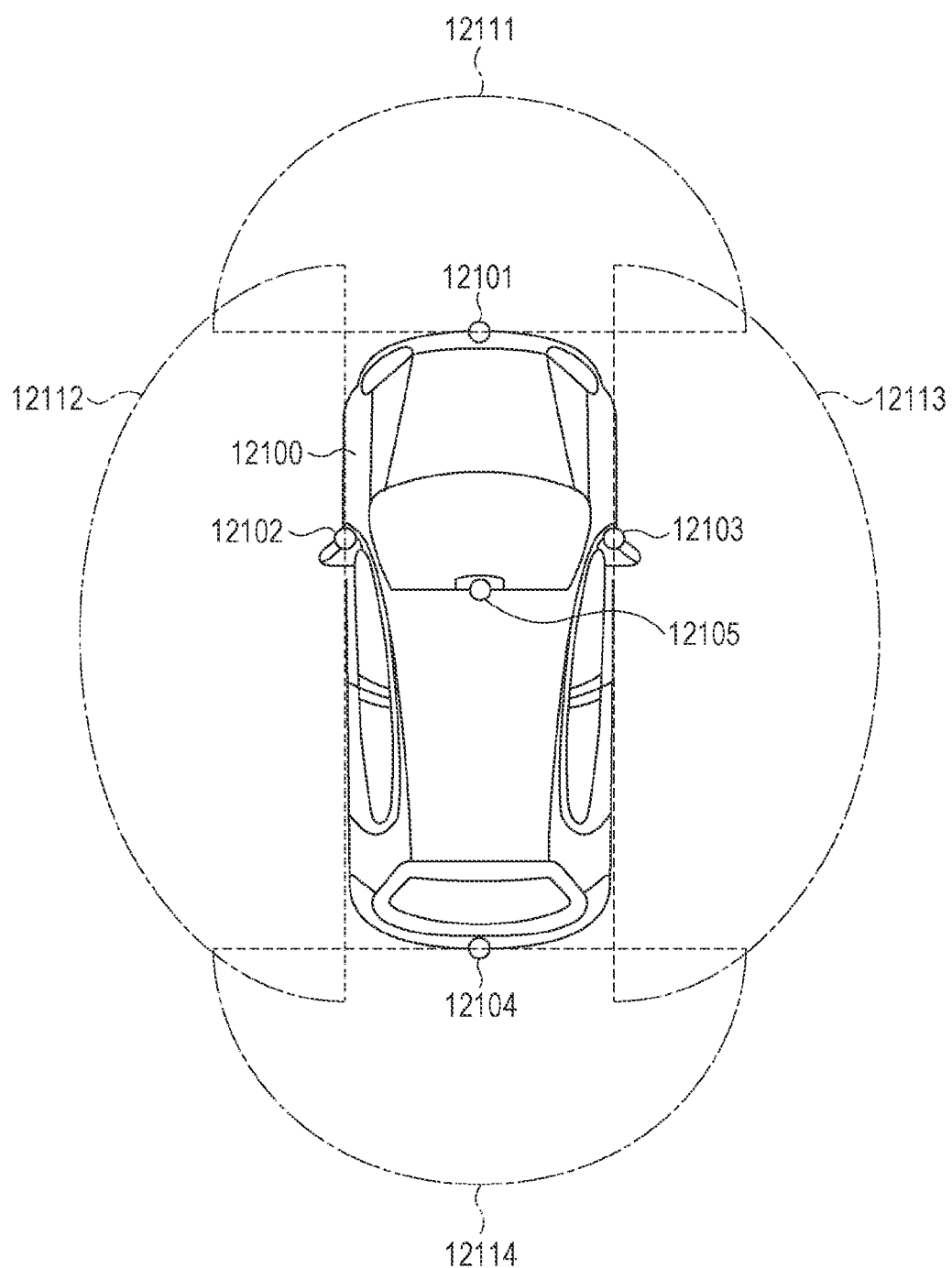
FIG. 19 is a diagram of assistance in explaining an example of installation positions of an outside-vehicle information detecting section and an imaging unit.

FIG. 19 is a diagram showing an example of the installation position of the imaging unit 12031.

In FIG. 19, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The imaging units 12101 and 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 illustrates an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in captured images of the imaging units 12101 to 12104. Such recognition of a pedestrian is, for example, performed by a procedure of extracting characteristic points in the captured images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the captured images of the imaging units 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

Hereinabove, an example of a vehicle control system to which the technology according to the present disclosure (present technology) can be applied is described. The technology according to the present disclosure can be applied to, of the configuration described above, for example, the imaging unit 12031 or the like. Specifically, the solid-state imaging device according to the present technology can be used for the imaging unit 12031. By applying the technology according to the present disclosure to the imaging unit 12031, properties of the imaging unit 12031 can be improved.

Note that the present technology is not limited to the embodiments and use examples described above, and may include various alterations without departing from the spirit of the present technology.

Further, the effects described in the present specification are only examples and are not limitative ones, and there may be other effects.

Additionally, the present technology may also be configured as below.

[1]

A photoelectric conversion element including at least: a first electrode; a work function control layer; a photoelectric conversion layer; an oxide semiconductor layer; and a second electrode in this order, and further including a third electrode, in which the third electrode is provided apart from the second electrode and is provided facing the photoelectric conversion layer via an insulating layer, and the work function control layer contains a larger amount of oxygen than an amount of oxygen satisfying a stoichiometric composition.

[2]

The photoelectric conversion element according to [1], in which the work function control layer contains a hexavalent molybdenum oxide, a pentavalent molybdenum oxide, and a tetravalent molybdenum oxide, and an amount of the hexavalent molybdenum oxide is larger than a total amount of the pentavalent molybdenum oxide and the tetravalent molybdenum oxide.

[3]

The photoelectric conversion element according to [1] or [2], in which the work function control layer contains a molybdenum oxide of a nonstoichiometric composition.

[4]

The photoelectric conversion element according to any one of [1] to [3], in which the work function control layer contains a hexavalent tungsten oxide, a pentavalent tungsten oxide, and a tetravalent tungsten oxide, and an amount of the hexavalent tungsten oxide is larger than a total amount of the pentavalent tungsten oxide and the tetravalent tungsten oxide.

[5]

The photoelectric conversion element according to any one of [1] to [4], in which the work function control layer contains a tungsten oxide of a nonstoichiometric composition.

[6]

The photoelectric conversion element according to any one of [1] to [5], in which the work function control layer contains an oxide containing molybdenum and at least one metal element other than molybdenum.

[7]

The photoelectric conversion element according to [6], in which an amount of the at least one metal element other than molybdenum contained in the oxide is larger than an amount of the molybdenum contained in the oxide.

[8]

The photoelectric conversion element according to [6] or [7], in which the at least one metal element other than molybdenum is a metal element of group 12 of a periodic table, a metal element of group 13 of the periodic table, or a metal element of group 14 of the periodic table.

[9]

The photoelectric conversion element according to [6] or [7], in which the at least one metal element other than molybdenum is indium.

[10]

The photoelectric conversion element according to any one of [1] to [9], further including a p-type buffer layer between the work function control layer and the photoelectric conversion layer.

[11]

The photoelectric conversion element according to any one of [1] to [10], further including an n-type buffer layer between the photoelectric conversion layer and the at least one oxide semiconductor layer.

[12]

The photoelectric conversion element according to any one of [1] to [11], further including an auxiliary layer between the first electrode and the work function control layer.

[13]

A photoelectric conversion element including at least: a first electrode; a work function control layer; a photoelectric conversion layer; an oxide semiconductor layer; and a second electrode in this order, and further including a third electrode, in which the third electrode is provided apart from the second electrode and is provided facing the photoelectric conversion layer via an insulating layer, and the work function control layer contains an oxide containing molybdenum and at least one metal element other than molybdenum.

[14]

The photoelectric conversion element according to [13], in which an amount of the at least one metal element other than molybdenum contained in the oxide is larger than an amount of the molybdenum contained in the oxide.

[15]

The photoelectric conversion element according to [13] or [14], in which the at least one metal element other than molybdenum is a metal element of group 12 of a periodic table, a metal element of group 13 of the periodic table, or a metal element of group 14 of the periodic table.

[16]

The photoelectric conversion element according to [13] or [14], in which the at least one metal element other than molybdenum is indium.

[17]

The photoelectric conversion element according to any one of [13] to [16], further including a p-type buffer layer between the work function control layer and the photoelectric conversion layer.

[18]

The photoelectric conversion element according to any one of [13] to [17], further including an n-type buffer layer between the photoelectric conversion layer and the at least one oxide semiconductor layer.

[19]

The photoelectric conversion element according to any one of [13] to [188], further including an auxiliary layer between the first electrode and the work function control layer.

[20]

A solid-state imaging device, in which at least one or a plurality of the photoelectric conversion elements according to any one of [1] to [19] and a semiconductor substrate are stacked for each of a plurality of one-dimensionally or two-dimensionally arranged pixels.

[21] An electronic device including: the solid-state imaging device according to [20].

REFERENCE SIGNS LIST 100, 150 Photoelectric conversion element
101, 151 First electrode
102, 152 Photoelectric conversion layer
103, 153 n-type buffer layer
104, 154 Oxide semiconductor layer
105, 155 Third electrode
106, 156 Insulating layer
107, 157 Second electrode
108, 158 Work function control layer
109, 159 p-type buffer layer

What is claimed is:

1. A photoelectric conversion element, comprising:
a first electrode;
a work function control layer that contains a hexavalent tungsten oxide, a pentavalent tungsten oxide, and a tetravalent tungsten oxide, wherein
the work function control layer has a larger amount of oxygen than an amount of oxygen satisfying a stoichiometric composition, and
an amount of the hexavalent tungsten oxide is larger than a total amount of the pentavalent tungsten oxide and the tetravalent tungsten oxide;
a photoelectric conversion layer;
an oxide semiconductor layer;
a second electrode, wherein the first electrode, the work function control layer, the photoelectric conversion layer, the oxide semiconductor layer, and the second electrode are in this order;
an insulating layer; and
a third electrode, wherein
the third electrode is apart from the second electrode, and
the third electrode faces the photoelectric conversion layer via the insulating layer.

2. The photoelectric conversion element according to claim 1, wherein
the work function control layer further contains a hexavalent molybdenum oxide, a pentavalent molybdenum oxide, and a tetravalent molybdenum oxide, and
an amount of the hexavalent molybdenum oxide is larger than a total amount of the pentavalent molybdenum oxide and the tetravalent molybdenum oxide.

3. The photoelectric conversion element according to claim 1, wherein the work function control layer further contains a molybdenum oxide of a nonstoichiometric composition.

4. The photoelectric conversion element according to claim 1, further comprising a p-type buffer layer between the work function control layer and the photoelectric conversion layer.

5. The photoelectric conversion element according to claim 1, further comprising an n-type buffer layer between the photoelectric conversion layer and the oxide semiconductor layer.

6. The photoelectric conversion element according to claim 1, further comprising an auxiliary layer between the first electrode and the work function control layer.

7. A photoelectric conversion element, comprising:
a first electrode;
a work function control layer that contains
a hexavalent tungsten oxide, a pentavalent tungsten oxide, and a tetravalent tungsten oxide, wherein an amount of the hexavalent tungsten oxide is larger than a total amount of the pentavalent tungsten oxide and the tetravalent tungsten oxide, and
an oxide containing molybdenum and at least one metal element different from the molybdenum and tungsten,
wherein the work function control layer has a larger amount of oxygen than an amount of oxygen satisfying a stoichiometric composition;
a photoelectric conversion layer;
an oxide semiconductor layer;
a second electrode, wherein the first electrode, the work function control layer, the photoelectric conversion layer, the oxide semiconductor layer, and the second electrode are in this order;
an insulating layer; and
a third electrode, wherein
the third electrode is apart from the second electrode, and
the third electrode faces the photoelectric conversion layer via the insulating layer.

8. The photoelectric conversion element according to claim 7, wherein an amount of the at least one metal element is larger than an amount of the molybdenum contained in the oxide.

9. The photoelectric conversion element according to claim 7, wherein the at least one metal element is one of
a metal element of group 12 of a periodic table,
a metal element of group 13 of the periodic table, or
a metal element of group 14 of the periodic table.

10. The photoelectric conversion element according to claim 7, wherein the at least one metal element is indium.

11. A light detecting device, comprising:
a photoelectric conversion element which includes:
a first electrode;
a work function control layer that contains a hexavalent tungsten oxide, a pentavalent tungsten oxide, and a tetravalent tungsten oxide, wherein
the work function control layer has a larger amount of oxygen than an amount of oxygen satisfying a stoichiometric composition, and
an amount of the hexavalent tungsten oxide is larger than a total amount of the pentavalent tungsten oxide and the tetravalent tungsten oxide;
a photoelectric conversion layer;
an oxide semiconductor layer;
a second electrode, wherein the first electrode, the work function control layer, the photoelectric conversion layer, the oxide semiconductor layer, and the second electrode are in this order;
an insulating layer; and
a third electrode, wherein
the third electrode is apart from the second electrode, and
the third electrode faces the photoelectric conversion layer via the insulating layer; and
a semiconductor substrate, wherein
the photoelectric conversion element and the semiconductor substrate are stacked for each of a plurality of one-dimensionally arranged pixels or two-dimensionally arranged pixels.

12. An electronic device comprising a light detecting device, wherein
the light detecting device, comprising:
a photoelectric conversion element which includes:
a first electrode:
a work function control layer that contains a hexavalent tungsten oxide, a pentavalent tungsten oxide, and a tetravalent tungsten oxide, wherein
the work function control layer has a larger amount of oxygen than an amount of oxygen satisfying a stoichiometric composition, and
an amount of the hexavalent tungsten oxide is larger than a total amount of the pentavalent tungsten oxide and the tetravalent tungsten oxide;
a photoelectric conversion layer;
an oxide semiconductor layer;
a second electrode, wherein the first electrode, the work function control layer, the photoelectric conversion layer, the oxide semiconductor layer, and the second electrode are in this order;
an insulating layer; and
a third electrode, wherein
the third electrode is apart from the second electrode, and
the third electrode faces the photoelectric conversion layer via the insulating layer; and
a semiconductor substrate, wherein the photoelectric conversion element and the semiconductor substrate are stacked for each of a plurality of one-dimensionally arranged pixels or two-dimensionally arranged pixels.

* * * * *